(12) United States Patent
Natan et al.

(10) Patent No.: US 12,480,828 B2
(45) Date of Patent: Nov. 25, 2025

(54) ELECTRONIC DEVICES AND METHODS OF MANUFACTURING ELECTRONIC DEVICES

(71) Applicant: Amkor Technology Singapore Holding Pte. Ltd., Valley Point (SG)

(72) Inventors: Lawrence Natan, Chandler, AZ (US); Remrose Manuel, Cavite (PH); Adrian Arcedera, Chandler, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 287 days.

(21) Appl. No.: 17/994,088

(22) Filed: Nov. 25, 2022

(65) Prior Publication Data

US 2024/0175772 A1 May 30, 2024

(51) Int. Cl.
*G01L 13/02* (2006.01)
*G01L 19/00* (2006.01)
*G01L 19/14* (2006.01)

(52) U.S. Cl.
CPC ........ *G01L 13/025* (2013.01); *G01L 19/0038* (2013.01); *G01L 19/147* (2013.01)

(58) Field of Classification Search
CPC ......... G01L 13/00–028; G01L 19/0038; G01L 19/14–148
See application file for complete search history.

(56) References Cited

U.S. PATENT DOCUMENTS

| | | | |
|---|---|---|---|
| 8,519,492 B2 | 8/2013 | Song | |
| 8,618,619 B1 | 12/2013 | Miks et al. | |
| 11,053,115 B2 * | 7/2021 | Ghidoni | G01J 1/429 |
| 11,137,305 B2 * | 10/2021 | Suzu | G01L 19/143 |
| 2004/0048128 A1 | 3/2004 | Jankowski et al. | |
| 2011/0198714 A1 | 8/2011 | Yang | |
| 2013/0136291 A1 | 5/2013 | Lee et al. | |
| 2013/0241045 A1 | 9/2013 | Golda et al. | |
| 2020/0284677 A1 * | 9/2020 | Wagner | G01L 19/147 |
| 2024/0003770 A1 * | 1/2024 | Do | H05K 1/181 |

* cited by examiner

*Primary Examiner* — Justin N Olamit
(74) *Attorney, Agent, or Firm* — Kevin B. Jackson

(57) ABSTRACT

In one example, an electronic device includes a substrate structure and a housing. The housing is coupled to the substrate structure and includes a first chamber, a second chamber isolated from the first chamber, a first port comprising a first passage coupled to the first chamber, and a second port comprising a second passage coupled to the second chamber. An electronic component within the first chamber and includes a top side and a lower side opposite to the top side and isolated from the top side. The top side of the electronic component is configured to receive a first stimulus through the first passage and the first chamber, and the lower side of the electronic component is configured to receive a second stimulus through the second passage and the second chamber. Other examples and related methods are also disclosed herein.

16 Claims, 19 Drawing Sheets

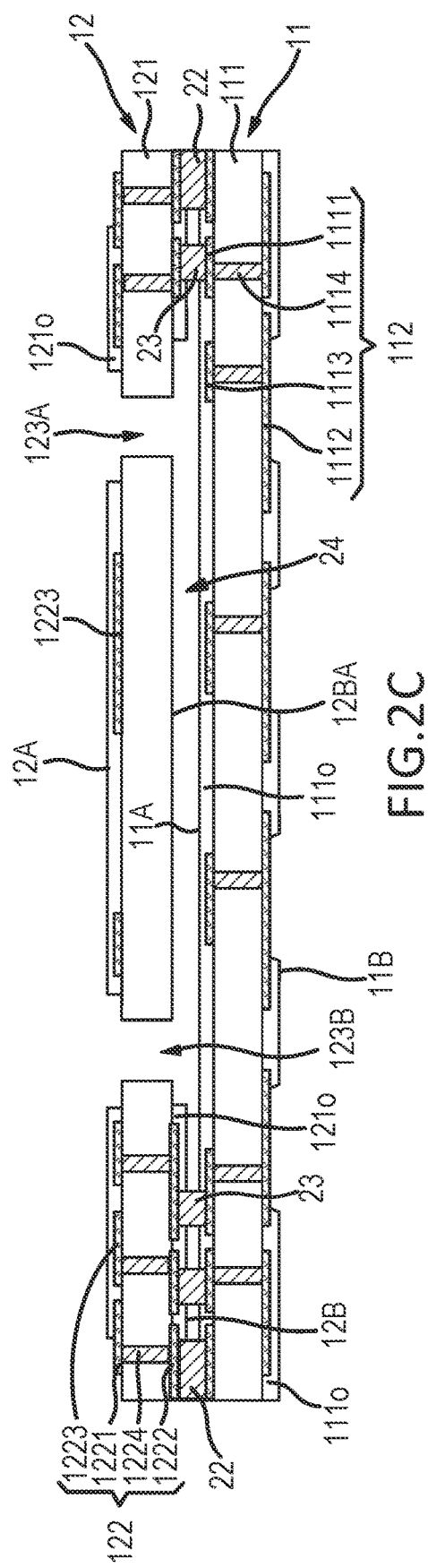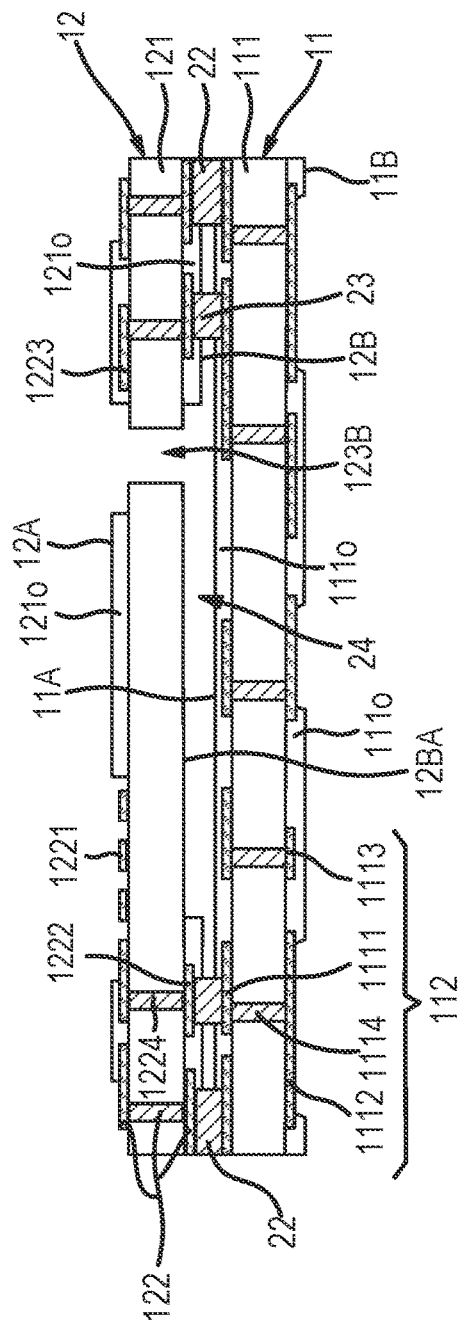

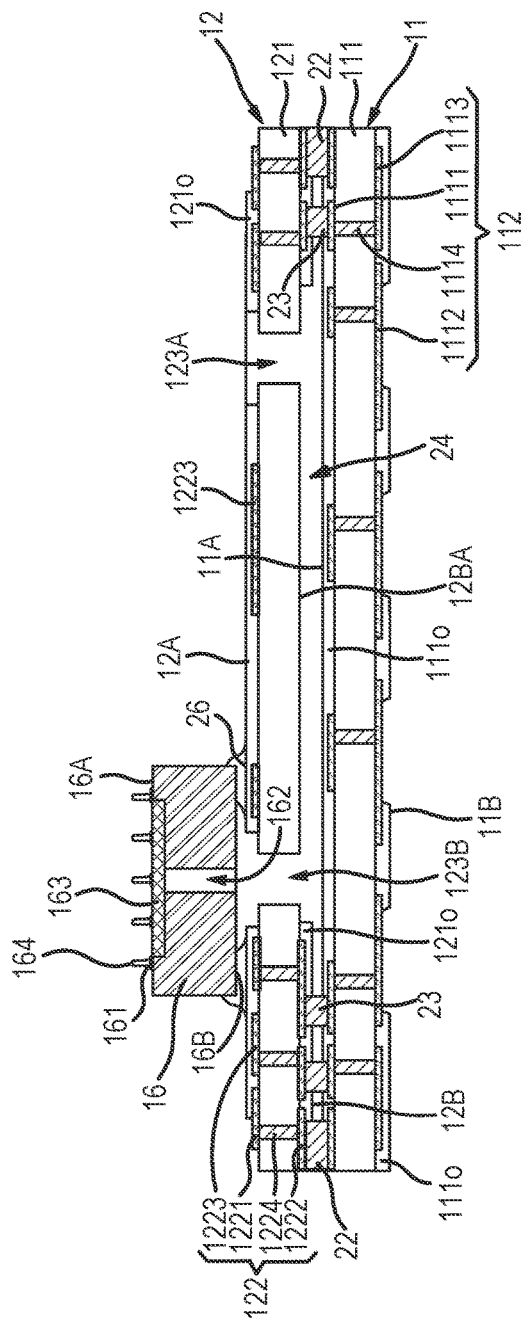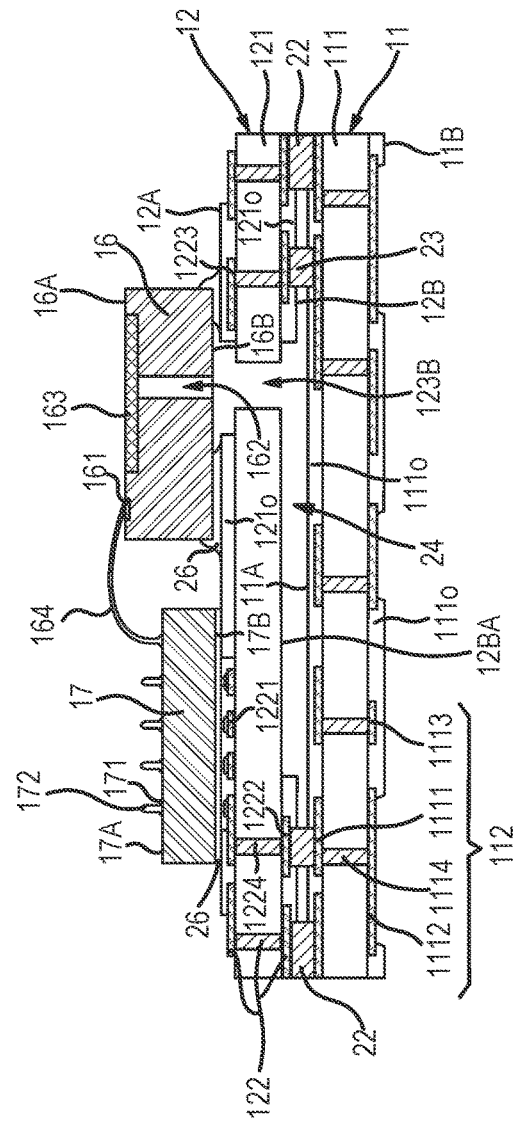
FIG.2D
FIG.2D-1

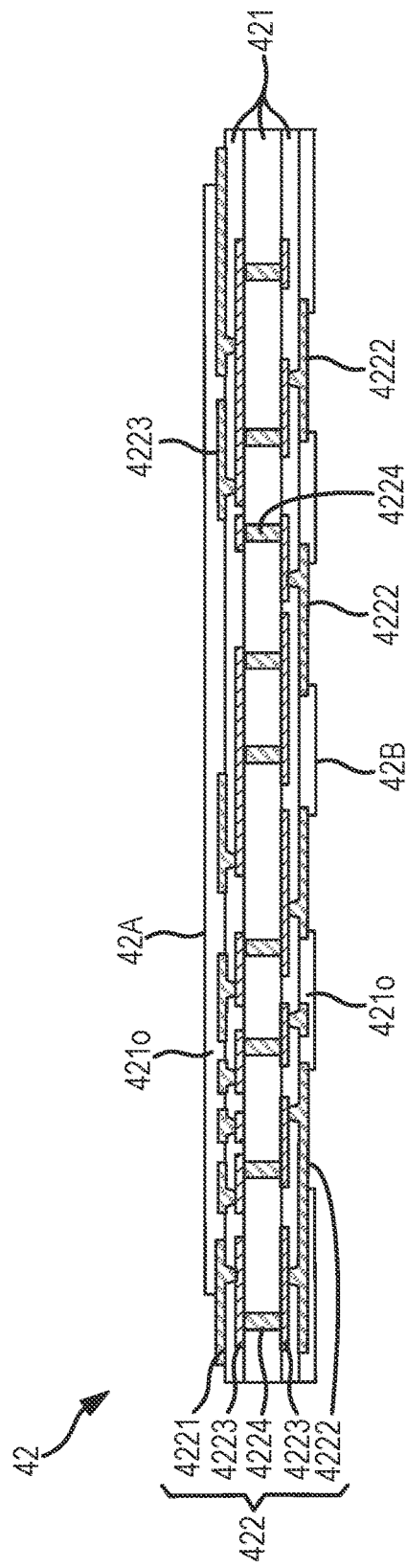
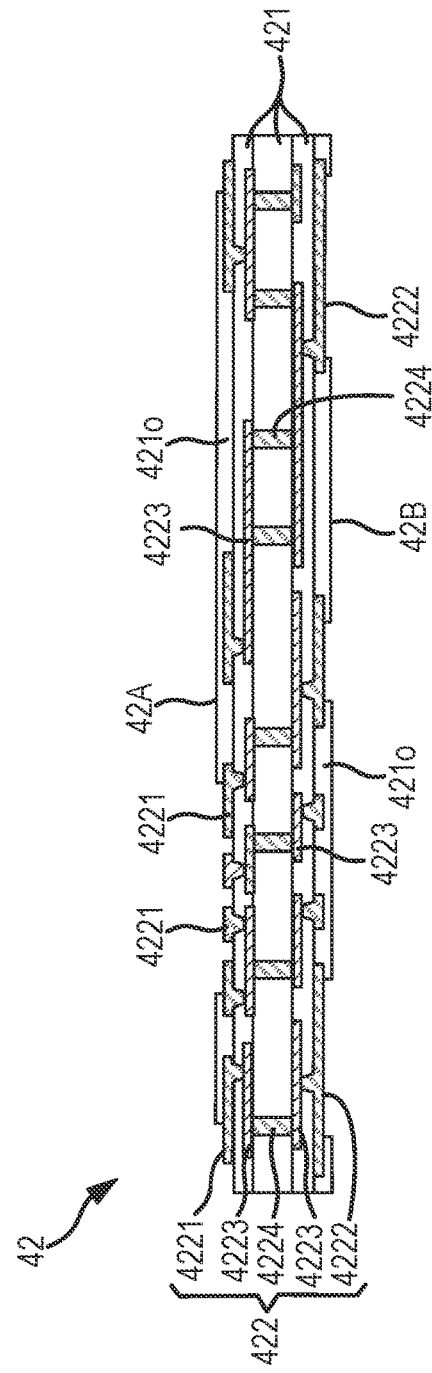

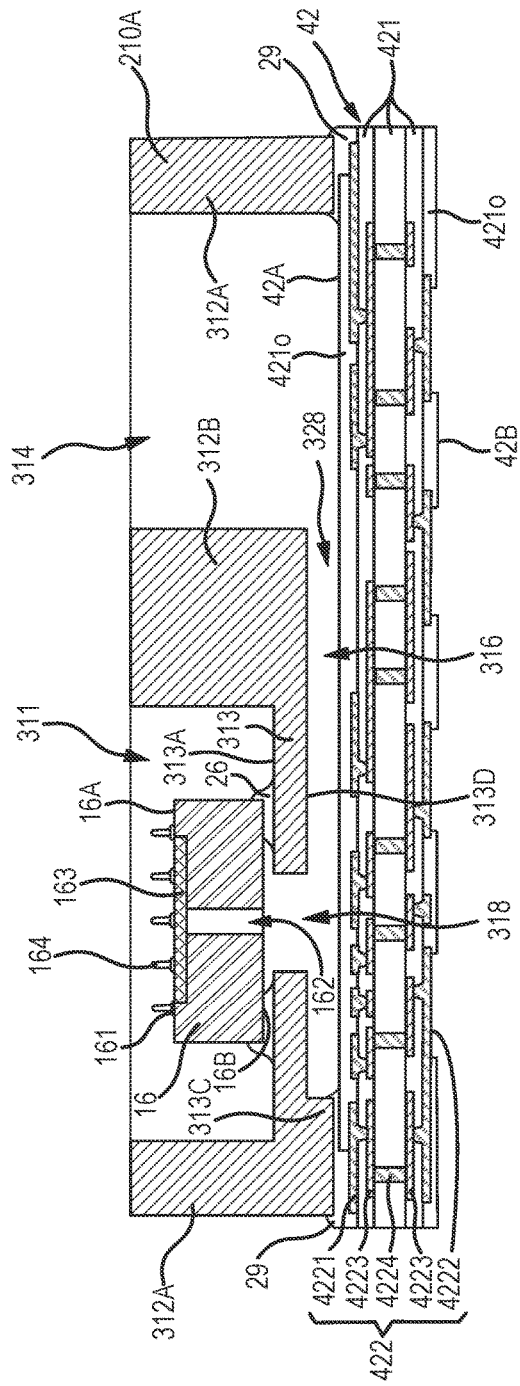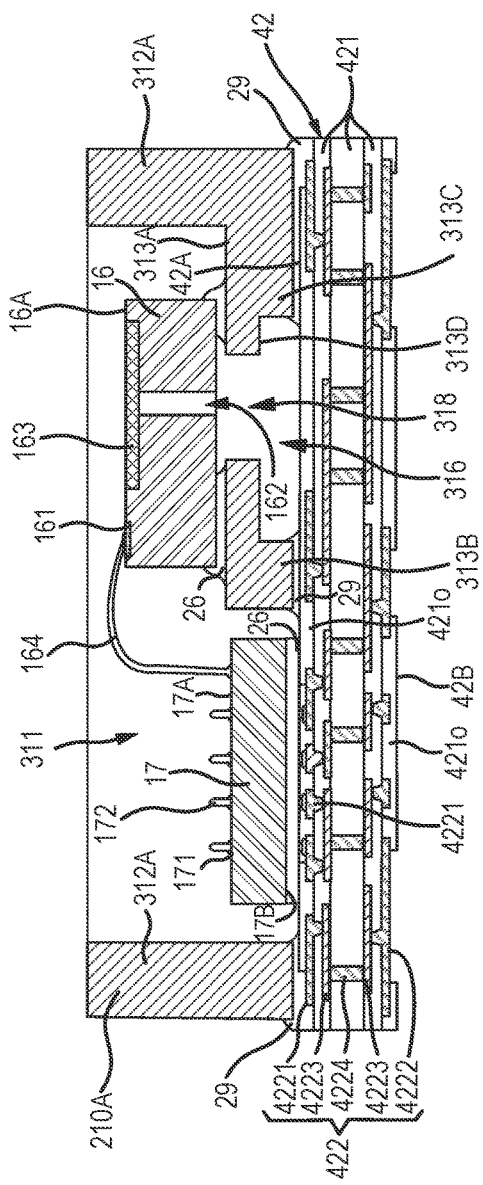
FIG.4C
FIG.4C-1

ELECTRONIC DEVICES AND METHODS OF MANUFACTURING ELECTRONIC DEVICES

CROSS-REFERENCE TO RELATED APPLICATIONS

Not applicable.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2B-1, 2C, 2C-1, 2D, 2D-1, 2E, and 2E-1 illustrate cross-sectional views of an example method for manufacturing an example electronic device.

FIGS. 4A, 4A-1, 4B, 4B-1, 4C, 4C-1, 4D, and 4D-1 illustrate cross-sectional views of an example method for manufacturing an example electronic device.

Figure 1A:
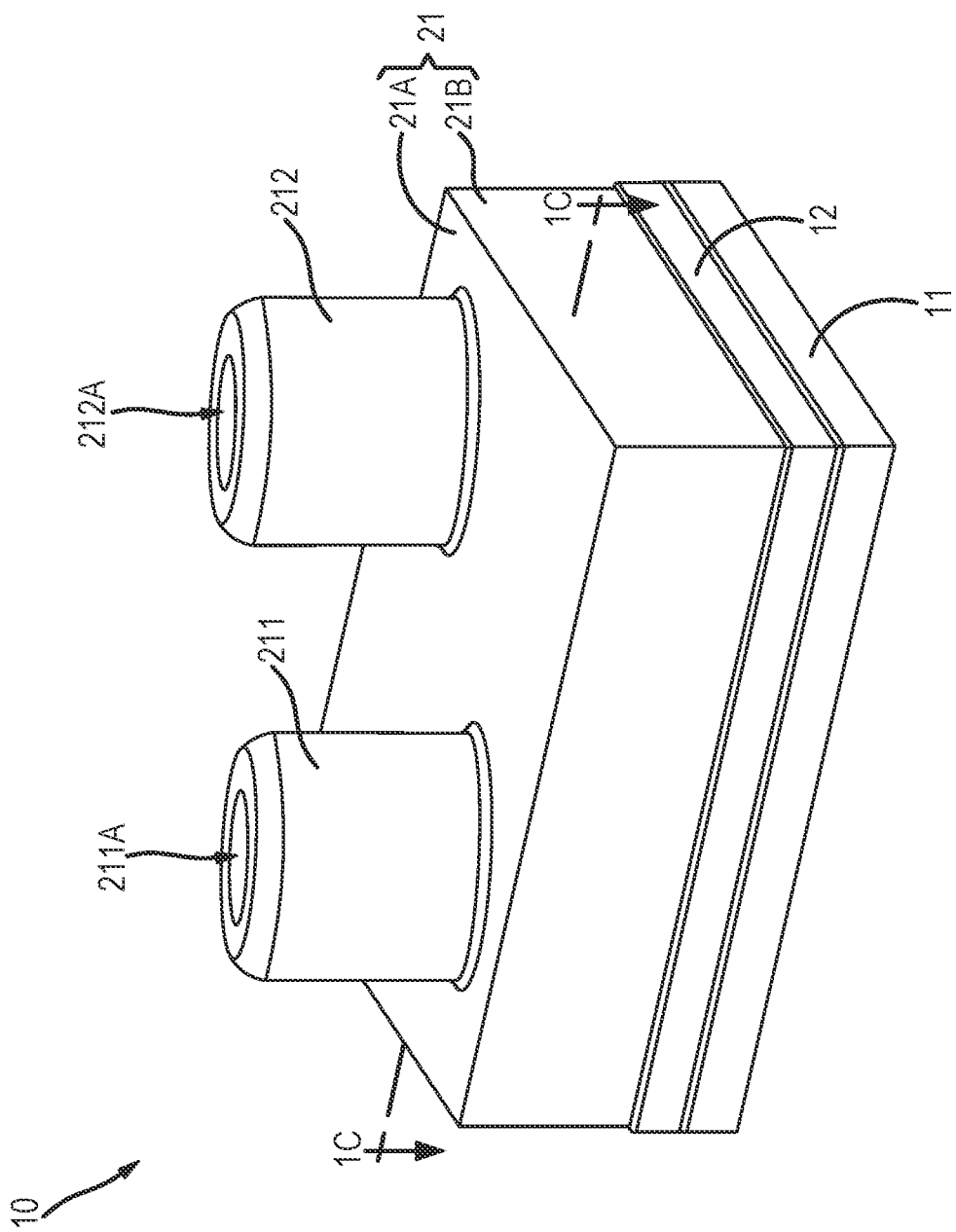
FIG. 1A illustrates a perspective view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions of details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. Crosshatching lines may be used throughout the figures to denote different parts but not necessarily to denote the same or different materials. Throughout the present disclosure, like reference numbers denote like elements. Accordingly, elements with like element numbering may be shown in the figures but may not be necessarily repeated herein for the sake of clarity.

The term "or" means any one or more of the items in the list joined by "or." As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including" are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or to describe two elements indirectly connected by one or more other elements. For example, if element A is coupled to element B, then element A can be directly contacting element B or indirectly connected to element B by an intervening element C. As used herein, the term coupled can refer to an electrical coupling or a mechanical coupling. Similarly, the terms "over" or "on" may be used to describe two elements directly contacting each other or to describe two elements indirectly connected by one or more other elements.

DESCRIPTION

The present description includes, among other features, structures and associated methods that relate to electronic devices with a plurality of isolated passages that each provide a pathway for stimuli to communicate with a sensor component. In some examples, the sensor component can be a differential pressure sensor and the stimuli can be different pressures. In an example, the electronic device can include a stacked substrate configuration to provide a first passage and an integrated housing to provide a second passage and a port to the first passage. In another example, the electronic device can include a multiple-piece or stacked housing configuration to provide a first passage and a second passage isolated from the first passage. Among other things, the structures and methods provide a smaller form factor, which reduces board space requirements compared to prior devices. Also, the structures and methods avoid high manufacturing costs associated with dedicated molding systems by instead using housing that are more universal.

In an example, an electronic device includes a substrate structure and a housing coupled to the substrate structure. The housing includes a housing top, housing walls, a first port extending outward from the housing top, and a second port extending outward from the housing top. The substrate structure, the housing top, and the housing walls define a first chamber and a second chamber isolated from the first chamber. The first port is fluidly coupled to the first chamber and the second port is fluidly coupled to the second chamber. A first electronic component within the first chamber and includes a top side and a lower side opposite to the top side and isolated from the top side. The top side of the first electronic component is in fluid communication with the first chamber and the first port and is configured to receive a first stimulus, and the lower side of the first electronic component is in fluid communication with the second chamber and the second port and is configured to receive a second stimulus.

In an example, an electronic device includes a substrate structure and a housing. The housing is coupled to the substrate structure and includes a first chamber, a second chamber isolated from the first chamber, a first port comprising a first passage coupled to the first chamber, and a second port comprising a second passage coupled to the second chamber. A first electronic component within the first chamber and includes a top side and a lower side opposite to the top side and isolated from the top side. The top side is configured to receive a first stimulus through the first passage and the first chamber, and the lower side is configured to receive a second stimulus through the second passage and the second chamber.

In an example, a method of manufacturing an electronic device includes providing a substrate structure. The method includes providing a housing including a first chamber, a second chamber isolated from the first chamber, a first port comprising a first passage coupled to the first chamber, and a second port comprising a second passage coupled to the second chamber. The method includes providing a first electronic component including a top side and a lower side opposite to the top side. The method includes coupling the first electronic component to one of the substrate structure or the housing within the first chamber. The top side of the first electronic component is isolated from the lower side of the first electronic component. The top side of the first electronic component is configured to receive a first stimulus within the first chamber. The lower side of the first electronic component is configured to receive a second stimulus within the second chamber.

Other examples are included in the present disclosure. Such examples may be found in the figures, in the claims, or in the description of the present disclosure.

Figure 1B:
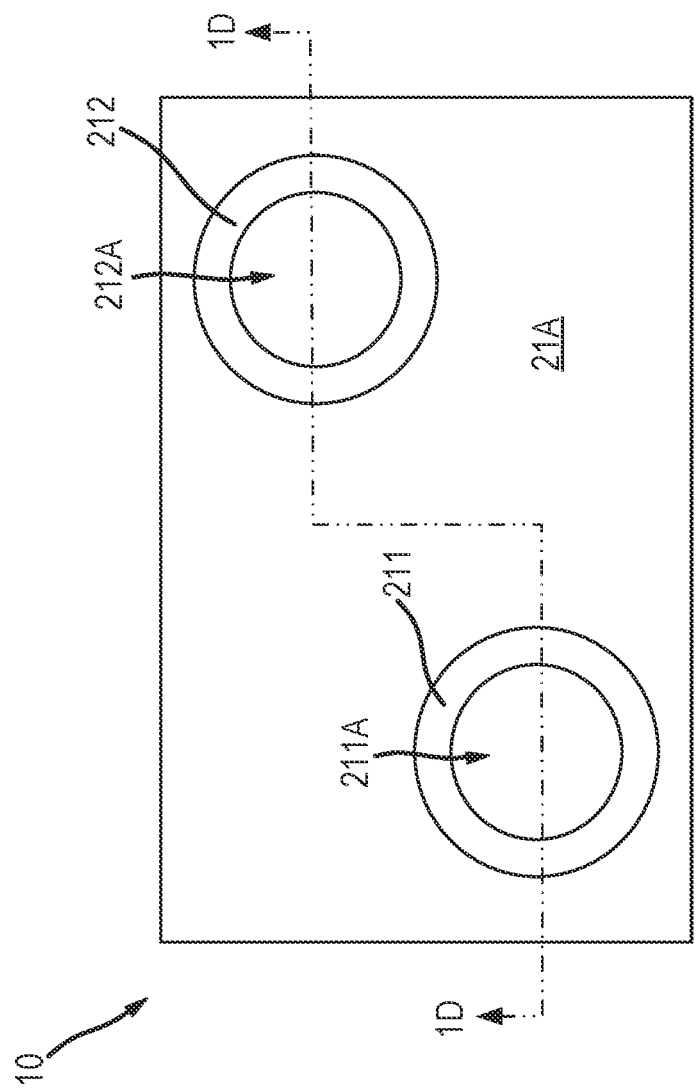
FIG. 1B illustrates a top plan view of the example electronic device of FIG. 1A.
Figure 1C:
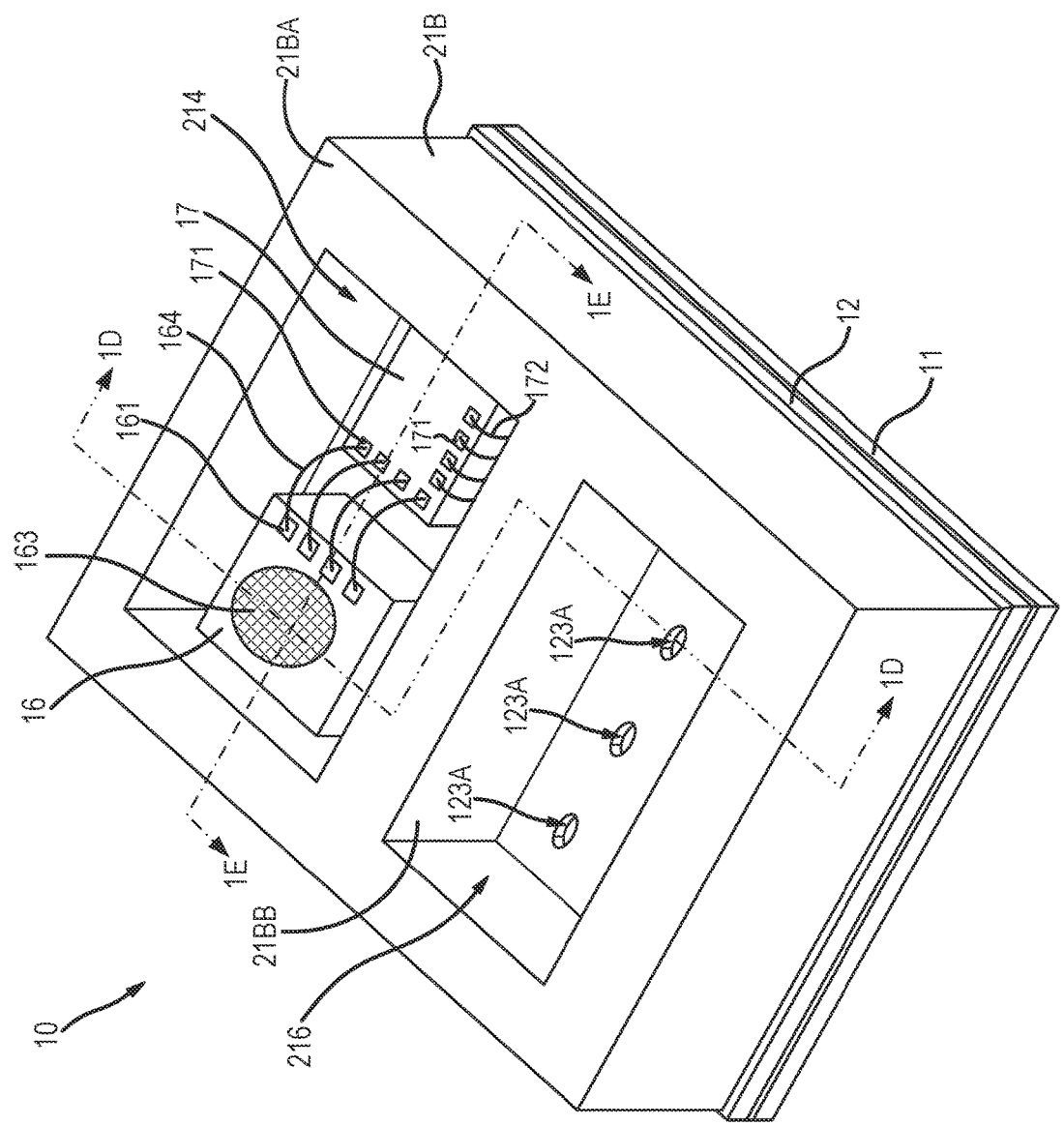
FIG. 1C illustrates a perspective view of a portion of the example electronic device of FIG. 1A taken along reference line 1C-1C.
Figure 1D:
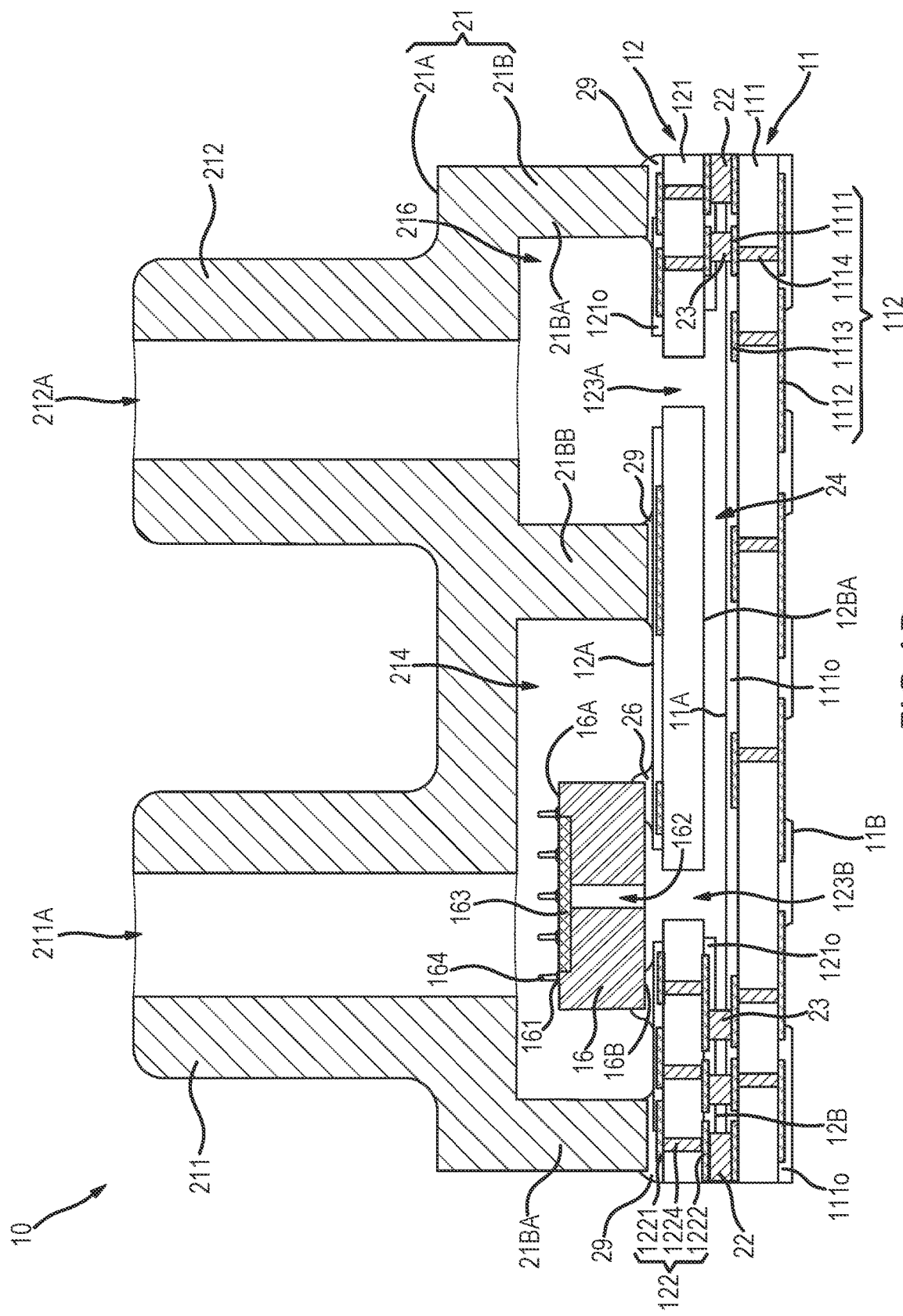
FIG. 1D illustrates a cross-sectional view of the example electronic device of FIG. 1A taken along reference line 1D-1D of FIG. 1B and reference line 1D-1D of FIG. 1C.
Figure 1E:
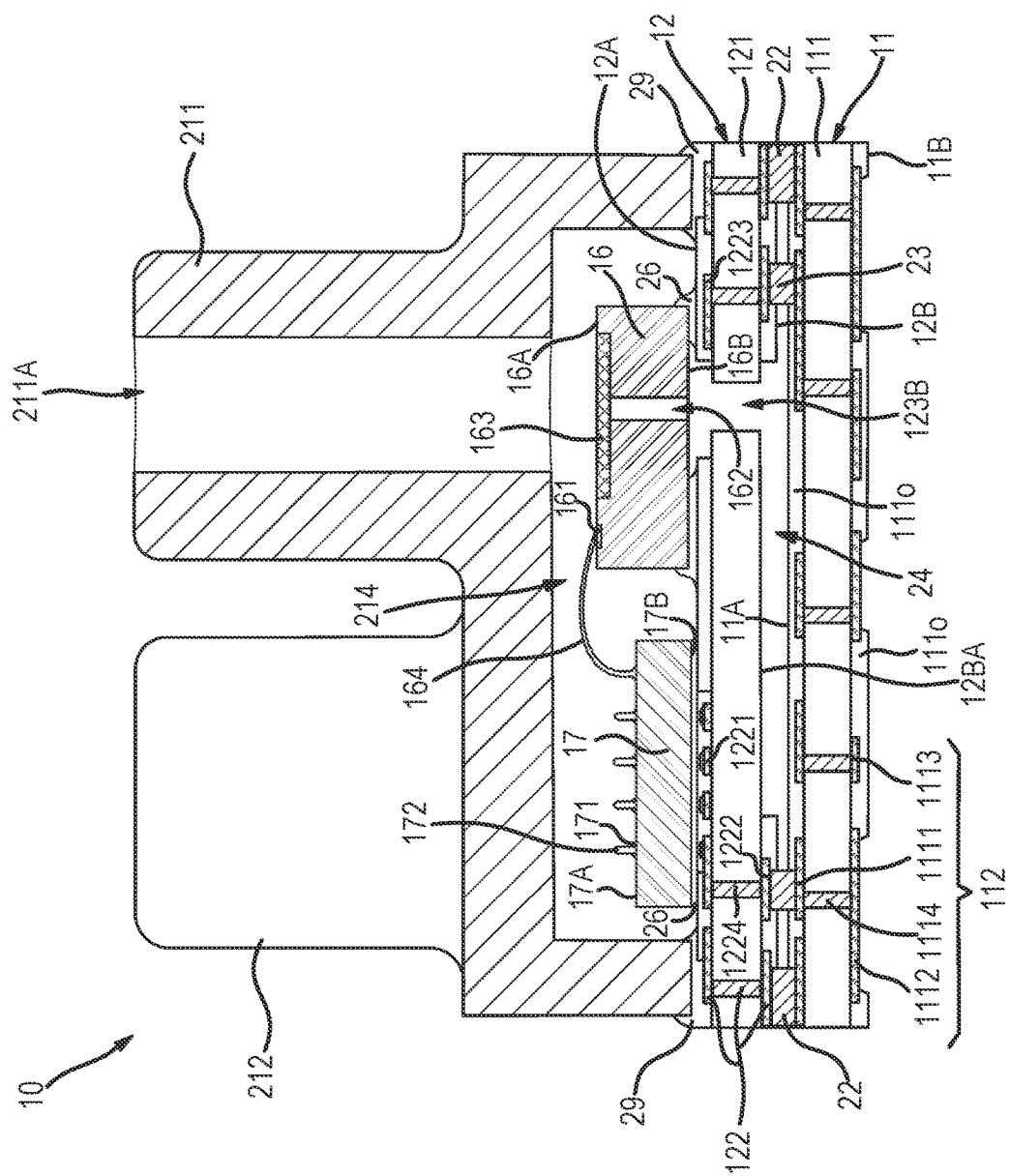
FIG. 1E illustrates a cross-sectional view of the example electronic device of FIG. 1A taken along reference line 1E-1E of FIG. 1C.

FIG. 1A illustrates a perspective view of an example electronic device 10, FIG. 1B illustrates a top plan view of electronic device 10, FIG. 1C illustrates a perspective view of a portion of electronic device 10 taken along reference line 1C-1C of FIG. 1A, FIG. 1D illustrates a cross-sectional view of electronic device 10 taken along reference line 1D-1D of FIG. 1B and reference line 1D-1D of FIG. 1C, and FIG. 1E illustrates a cross-sectional view of electronic device 10 taken along reference line 1E-1E of FIG. 1C. In the example illustrated in FIGS. 1A to 1E, electronic device 10 can comprise a first substrate 11, a second substrate 12, an electronic component 16, an electronic component 17, and a housing 21. In the present example, electronic device 10 is configured as a differential pressure sensor device; however, it is understood that the present description is relevant to any type of electronic device where exposing multiple portions of an electronic component to multiple isolated stimuli are required. For example, electronic device 10 can be configured as a variable force actuator, a multi-environment sensor, a temperature sensor, a chemical sensor, or other sensor devices as known to one of ordinary skill in the art.

With reference to FIGS. 1D and 1E, first substrate 11 can comprise a dielectric structure 111, a conductive structure 112, a substrate inner side 11A, and a substrate outer side 11B opposite to substrate inner side 11A. Second substrate 12 can comprise a dielectric structure 121, a conductive structure 122, a substrate inner side 12A, and a substrate outer side 12B opposite to substrate inner side 12A. In some examples, substrate inner side 11A and substrate inner side 12A can be referred to as substrate top sides. In some examples, substrate outer side 11B and substrate outer side 12B can be referred to as substrate lower sides. In the present example, substrate outer side 12B for second substrate 12 faces substrate inner side 11A of first substrate 11.

In some examples, conductive structure 112 of first substrate 11 can comprise inner terminals 1111, outer terminals 1112, traces 1113, and embedded vias 1114. In some examples, dielectric structure 111 of first substrate 11 can comprise an outer dielectric layer 1110 that is over at least portions of conductive structure 112 on substrate inner side 11A or substrate outer side 11B of first substrate 11. In some examples, outer dielectric layer 1110 can comprise a mask, such as a solder mask.

In some examples, conductive structure 122 of second substrate 12 can comprise inner terminals 1221, outer terminals 1222, traces 1223, and embedded vias 1224. In some examples, dielectric structure 121 of second substrate 12 can comprise an outer dielectric layer 1210 that is over at least portions of conductive structure 122 on substrate inner side 12A or substrate outer side 12B. In some examples, outer dielectric layer 1210 can comprise a mask, such as a solder mask.

In some examples, inner terminals 1111 of first substrate 11 can be coupled to outer terminals 1222 of second substrate 12 with substrate interconnects 23, which can comprise a conductive material. In some examples, first substrate 11 and second substrate 12 are coupled at their respective outer edges with an attachment material 22, which can comprise an electrically and thermally conductive material. In other examples, attachment material 22 can be a thermally conductive and electrically insulative material. Attachment material 22 is configured to provide an environmentally isolating seal (for example, an air-tight seal) between first substrate 11 and second substrate 12.

Second substrate 12 comprises one or more first openings 123A and one or more second openings 123B. First openings 123A and second openings 123B extend from substrate inner side 12A to substrate outer side 12B. A portion of substrate inner side 11A of first substrate 11 and a portion of substrate lower side 12B of substrate 12 define a passage 24. Passage 24 is fluidly coupled to or in fluid communication with first openings 123A and second opening 123B. In the present example, attachment material 22 between first substrate 11 and second substrate 12 provides an environmental isolating seal for passage 24. In some examples, substrate outer side 12B of second substrate 12 includes a portion 12BA that can be devoid of conductive structure 122 or outer dielectric layer 1210. In some examples, portion 12BA comprises a portion of second substrate outer side 12B between at least one of first openings 123A and second opening 123B. In some examples, portion 12BA comprises a thickness that is less than other portions of second substrate 12. In some examples, this provides for an increased volume within passage 24. In some examples, passage 24 can be referred to as a back side chamber.

With reference to FIGS. 1C, 1D, and 1E, electronic component 16 can comprise a top side 16A, a lower side 16B opposite to top side 16A, and component terminals 161 adjacent to or over top side 16A. In some examples, electronic component 16 is coupled to substrate inner side 12A of second substrate 12 and overlies second opening 123B. In some examples, electronic component 16 is coupled to substrate inner side 12A of second substrate 12 with a component adhesive 26, which forms an environmental isolating seal (for example, an air-tight seal) that isolates lower side 16B from top side 16A.

In the present example, electronic component 16 is configured as a differential pressure sensor device and further comprises a pressure lead hole 162 extending inward from lower side 16B toward top side 16A and a diaphragm 163 adjacent to top side 16A and overlapping pressure lead hole 162. It is further contemplated and understood that electronic component 16 can comprise additional structures adjacent to top side 16A, such as, for example, strain sensitive elements coupled together for detecting changes in diaphragm 163 and providing output signals to component terminals 161. In some examples, electronic component 16 is coupled to substrate inner side 12A of second substrate 12 and overlies second opening 123B with pressure lead hole 162 in alignment with second opening 123B.

Electronic component 17 can comprise a top side 17A, a lower side 17B opposite to top side 17A, and component terminals 171 adjacent to top side 17A. In some examples, electronic component 17 can be placed adjacent to electronic component 16. In some examples, electronic component 17 can be coupled to substrate inner side 12A of second substrate 12 with component adhesive 26. In some examples, a first portion of component terminals 171 can be coupled to component terminals 161 of electronic component 16 with component interconnects 164, and second portion of component terminals 171 can be coupled to inner terminals 1221 of second substrate 12 with component interconnects 172. In some examples, electronic component 17 comprises a semiconductor chip or semiconductor component and can be configured as an Application Specific Integrated Circuit (ASIC) device that can receive electrical signals from electronic component 16, process the electrical signals, and send the process signals to a device external to electronic device 10 through conductive structure 122 and conductive structure 112. In some examples, electronic component 17 can be a semiconductor die. In some examples, electronic component 17 can be a packaged component.

With reference to FIGS. 1A-1E, housing 21 comprises a housing top 21A, housing walls 21B extending from a lower side of housing top 21A, first port 211 extending from a first part of an upper side of housing top 21A, and second port 212 extending from a second part of the upper side of housing top 21A. In some examples, first port 211 and second port 212 can have a cylindrical shape. In other examples, first port 211 and second port 212 can comprise other shapes and can each comprise a different shape. First port 211 comprises a passage 211A that extends through first port 211 and housing top 21A. Second port 212 comprises a passage 212A that extends through second port 212 and housing top 21A.

In the present example, housing walls 21B comprise an outer housing wall 21BA that defines an outer periphery for housing 21, and an inner housing wall 21BB. In the present example, outer housing wall 21BA, inner housing wall 21BB, and housing top 21A define a first chamber 214 that encloses electronic component 16 and electronic component 17. In addition, outer housing wall 21BA, inner housing wall 21BB, and housing top 21A define a second chamber 216 that can be isolated from first chamber 214. In the present example, second chamber 216 is fluidly coupled to or is in fluid communication with lower side 16B of electronic component 16 through first openings 123A in first substrate 11, passage 24 between first substrate 11 and second substrate 12, and second opening 123B in first substrate 11. Passage 211A within first port 211 is fluidly coupled to or is in fluid communication with top side 16A of electronic component 16 through first chamber 214. Passage 212A within second port 212 is fluidly coupled to or is in fluid communication with second chamber 216. More particularly, passage 211A and first chamber 214 provide a first pathway for a first stimulus, such as a first environmental condition to reach top side 16A of electronic component 16, and passage 212A, second chamber 216, and passage 24 provide a second pathway (which is isolated from the first pathway) for a second stimulus, such as a second environmental condition to reach lower 16B of electronic component 16. In the present example, the first environmental condition can be a first pressure and the second environmental condition can be a second pressure. Electronic component 16 can be configured to measure the pressure differential between the first pressure (or stimuli) and the second pressure (or stimuli) and, together with electronic component 17, can be used to detect an event, such as automotive collision and send a signal to deploy a safety apparatus, such as an air bag.

In some examples, housing 21 comprises a single-piece structure or an integral structure. In some examples, housing 21 comprises an insulating material. In some examples, housing 21 comprises a polymer, such as a liquid crystal polymer, and can be formed using injection molding techniques, 3-D printing techniques, or other techniques as known to one of ordinary skill in the art. Housing 21 can be coupled to top side 12A of second substrate 12 with an attachment material 29. Attachment material 29 provides an environmentally isolating (for example, an air-tight seal) between housing 21 and second substrate 12. In this way, first chamber 214 is environmentally isolated from second chamber 216, and first chamber 214 and second chamber 216 are environmentally isolated from the outside of electronic device 10.

First substrate 11, second substrate 12, and housing 21 can comprise or be referred to as an electronic package or a package and can protect electronic component 16 and electronic component 17 from exposure to external elements or the environment. The electronic package can also provide coupling between electronic component 16 and electronic component 17 and between electronic components 16 and 17 and external components or other electronic packages.

FIGS. 2A, 2B, 2B-1, 2C, 2C-1, 2D, 2D-1, 2E, and 2E-1 illustrate cross-sectional views of an example method for manufacturing an example electronic device 10. The cross-sections of FIGS. 2A, 2B, 2C, 2D, and 2E are taken along reference line 1D-1D of FIGS. 1B and 1C, and the cross-sections of FIGS. 2B-1, 2C-1, 2D-1, and 2E-1 are taken along reference line 1E-1E of FIG. 1C.

Figure 2A:
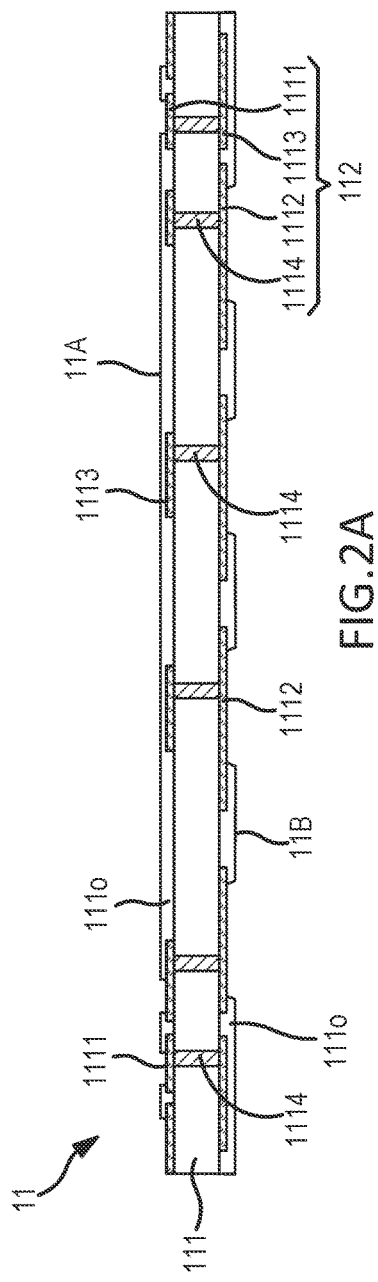

FIG. 2A illustrates a cross-sectional view of electronic device 10 at an early stage of manufacture. In the example illustrated in FIG. 2A, first substrate 11 can be provided. In some examples, first substrate 11 can comprise or be referred to as a rigid printed circuit board, a flexible printed circuit board, a laminate substrate, a redistribution layer (RDL) substrate, a coreless substrate, a ceramic substrate, a glass substrate, a silicon substrate, or a package substrate. In some examples, the thickness of first substrate 11 can range from approximately 20 micrometers (μm) to approximately 2000 μm.

First substrate 11 can comprise dielectric structure 111 and conductive structure 112. First substrate 11 can also comprise substantially planar substrate inner (or top) side 11A and substantially planar substrate outer (or lower) side 11B, which is opposite substrate inner side 11A. In some examples, inner refers to a direction or orientation that faces towards electronic component 16, and outer refers to a direction or orientation that faces away from electronic component 16.

Dielectric structure 111 can comprise or be referred to as one or more dielectric layers. Dielectric structure 111 can comprise silicon, glass, an organic material, FR4 (a laminate of copper foil-glass fiber fabric-copper foil), BT (bismaleimide triazine), polyimide (PI), benzocyclobutene (BCB), polybenzoxazole (PBO), or ceramic. In some examples, the thickness of dielectric structure 111 can range from approximately 3 µm to approximately 100 µm. In some examples, the thickness of dielectric structure 111 can refer to thicknesses of individual layers of dielectric structure 111. In some examples, the combined thickness of all layers of dielectric structure 111 can be similar to or equal to the thickness of first substrate 11. Dielectric structure 111 can maintain the shape of first substrate 11 and can also support conductive structure 112.

Conductive structure 112 can comprise or be referred to as one or more conductive layers, traces, pads, patterns, or under bumped metallization (UBM). Conductive structure 112 can comprise copper, aluminum, gold, silver, nickel, palladium, or an alloy. In some examples, the thickness of conductive structure 112 can range from approximately 3 µm to approximately 50 µm. In some examples, the thickness of conductive structure 112 can refer to thicknesses of individual layers of conductive structure 112. In some examples, the combined thickness of all layers of conductive structure 112 can be similar to or equal to the thickness of first substrate 11. Conductive structure 112 can provide electrical signal paths (e.g., vertical paths and/or horizontal paths) for electronic components 16 and 17.

Conductive structure 112 can comprise inner terminals 1111, outer terminals 1112, traces 1113, and embedded vias 1114. Inner terminals 1111 can be provided on the inner side of dielectric structure 111 (e.g., along substrate inner side 11A of first substrate 11). Inner terminals 1111 can be exposed from dielectric structure 111. Inner terminals 1111 can be coupled to traces 1113 and to embedded vias 1114. Inner terminals 1111 can comprise or be referred to as bond fingers, lands, or pads. Inner terminals 1111 and traces 1113 can comprise copper, aluminum, gold, silver, nickel, palladium, or an alloy. In some examples, the thicknesses of inner terminals 1111 and traces 1113 can range from approximately 3 µm to approximately 50 µm.

Outer terminals 1112 can be provided on the outer side of dielectric structure 111 (e.g., along substrate outer side 11B of first substrate 11). Outer terminals 1112 can be exposed from dielectric structure 111. Outer terminals 1112 can be coupled to embedded vias 1114 and traces 1113. Outer terminals 1112 can comprise or be referred to as bond fingers, lands, or pads. Outer terminals 1112 can comprise copper, aluminum, gold, silver, nickel, palladium, or an alloy. In some examples, the thicknesses of outer terminals 1112 can range from approximately 3 µm to approximately 50 µm. In some examples, outer terminals 1112 can be configured as land grid array (LGA) structures. In other examples, external interconnects can be coupled to outer terminals 1112. Such external interconnects can comprise or be referred to as solder balls, solder coated metal core balls (e.g., solder coated copper balls), pillars, pillars with solder caps, or bumps. For example, the external interconnects can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu.

Embedded vias 1114 provide electrical connection paths in an approximately vertical direction in dielectric structure 111, and can be coupled to inner terminals 1111, outer terminals 1112, or traces 1113. In some examples, the width (or diameter) of embedded vias 1114 can range from approximately 3 µm to approximately 100 µm. Traces 1113 provide electrical connection paths in an approximately horizontal direction (e.g., a direction generally perpendicular to embedded vias 1114) in dielectric structure 121.

In some examples, dielectric structure 111 comprises an outer dielectric layer 1110 over substrate inner side 11A or over substrate outer side 11B to protect portions of conductive structure 112. Openings can be provided in outer dielectric layer 1110 to expose portions of inner terminals 1111 or outer terminals 1112. In some examples, outer dielectric layer 1110 comprises a solder mask. In some examples, edge portions of substrate inner side 11A are devoid of outer dielectric layer 1110 as illustrated in FIG. 2A, which leaves a portion of conductive structure 112 exposed at the edge portions of substrate inner side 11A. In some examples, this feature enhances the adhesion between first substrate 11 and second substrate 12, which will be described in more detail later.

First substrate 11 may be produced in a variety of ways. In some examples, taking a silicon wafer as an example, first substrate 11 can be formed through the steps of: providing a through hole in the silicon wafer; providing an insulating layer on the surface of the silicon wafer; providing a seed layer on the surface of the insulating layer; providing a through electrode by plating a conductive material until the through hole is filled on the seed layer; providing a conductive layer on the surface of the silicon wafer to be connected to the through electrode and providing a conductor pattern through a photo process and an etching process; providing an insulating layer (e.g., a silicon oxide film or a silicon nitride film) on the conductor pattern; and removing a portion of the insulating layer to expose a portion of the conductor pattern. In some examples, these steps can be repeated several times, thereby providing a multilayer silicon substrate or interposer.

In some examples, taking a two-layer FR4 substrate as an example, first substrate 11 can be produced by the steps of: processing a drill hole to connect a lower copper foil and an upper copper foil, performing electroplating on the drill hole to electrically connect the lower copper foil and the upper copper foil; patterning an outer layer circuit including inner terminals and outer terminals on the inner side (lower surface) and outer side (upper surface) of the substrate by providing a photosensitive film on the substrate surface and photo-etching the photosensitive film so the surfaces of the lower copper foil and the upper copper foil are patterned; providing a seed layer for plating, which is thinner than the outer circuit by performing electroless plating on the entire upper and lower surfaces of the substrate to cover the outer circuit; providing a photosensitive film on the seed layer to cover the seed layer for plating, and photo-etching the photosensitive film to pattern the seed layer for plating; providing a solder resist layer over the entire upper and lower surfaces of the substrate so the outer circuit is exposed; and forming a plating layer on the outer circuit including inner terminals and outer terminals exposed outside of the solder resist layer by applying electricity to the plating seed layer.

In some examples, in the case of a three- to six-layer substrate, having layers more than the two-layer substrate, first substrate 11 can be provided by providing the steps of providing an inner-layer circuit and laminating, in addition to the above-described steps. As an example, the step of providing the inner layer circuit can be performed by photo-etching the photosensitive film so the surfaces of the upper copper foil and the lower copper foil are patterned for each substrate, thereby patterning the inner layer circuit on the lower surface and upper surface of each substrate. As an example, the laminating step can be performed by aligning each of the provided substrates as described above and allowing each of the substrates to be integrated into one substrate while providing predetermined temperature and pressure. In some examples, the dielectric structure can be a B-stage prepreg, and, after the laminating step, the dielectric structure can be in a C-stage state, and thus each substrate can be integrated, thereby providing a multilayer substrate. In some examples, after the laminating step, a hole processing step, a plating step, a step of providing an outer layer circuit, etc., can be sequentially provided in a similar manner as described above.

In some examples, first substrate 11 can be a pre-formed substrate. Pre-formed substrates can be manufactured prior to attachment to an electronic device and can comprise dielectric layers between respective conductive layers. The conductive layers can comprise, for example, copper and can be formed using an electroplating process. The dielectric layers can be non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrates can be formed through a semi-additive or modified-semi-additive process. Substrates in this disclosure can comprise pre-formed substrates.

In some examples, first substrate 11 can be a RDL substrate. RDL substrates can comprise one or more conductive redistribution layers and one or more dielectric layers and (a) can be formed layer by layer over an electronic device to which the RDL substrate is to be coupled, or (b) can be formed layer by layer over a carrier and then entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer.

Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or silicon oxynitride (SiON). The inorganic dielectric layer(s) can be formed by growing the inorganic dielectric layers using an oxidation or nitridization process rather than using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Substrates in this disclosure can comprise RDL substrates.

Figure 2B:
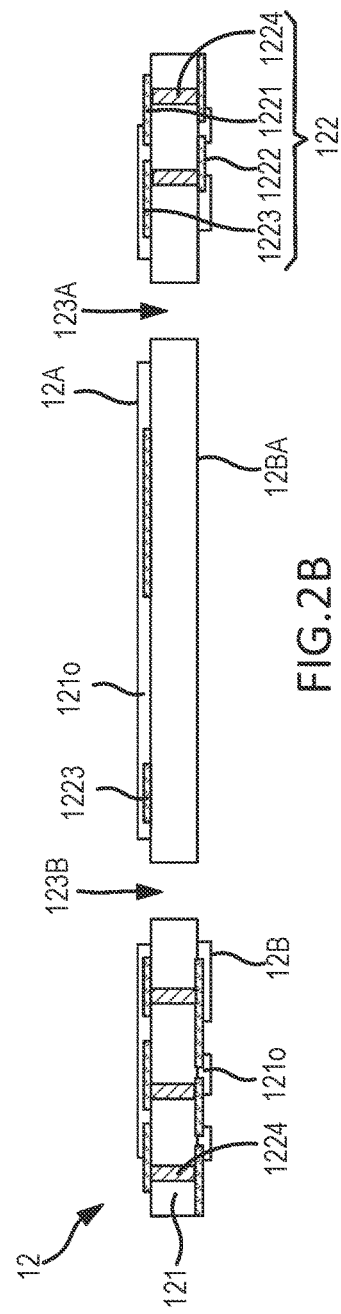
Figures 1, 2B:
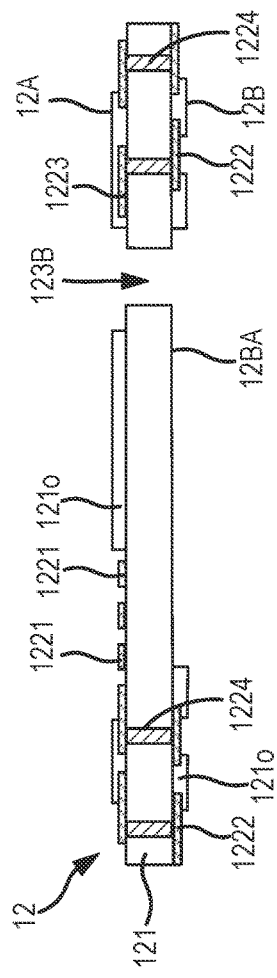

FIGS. 2B and 2B-1 illustrate cross-sectional views of electronic device 10 at an early stage of manufacture. In the example illustrated in FIGS. 2B and 2B-1, second substrate 12 can be provided. In some examples, second substrate 12 can comprise or be referred to as a rigid printed circuit board, a flexible printed circuit board, a laminate substrate, a redistribution layer (RDL) substrate, a coreless substrate, a ceramic substrate, a glass substrate, a silicon substrate, or a package substrate. In some examples, the thickness of substrate 12 can range from approximately 20 micrometers (μm) to approximately 2000 μm.

Second substrate 12 can comprise dielectric structure 121 and conductive structure 122. Second substrate 12 can also comprise substantially planar substrate inner (or top) side 12A and substantially planar substrate outer (or lower) side 12B, which is opposite substrate inner side 12A. Second substrate 12 further comprises first openings 123A and second opening 123B extending from substrate inner side 12A to substrate outer side 12B.

Dielectric structure 121 can comprise or be referred to as one or more dielectric layers. Dielectric structure 121 can comprise silicon, glass, an organic material, FR4 (a laminate of copper foil-glass fiber fabric-copper foil), BT (bismaleimide triazine), polyimide (PI), benzocyclobutene (BCB), polybenzoxazole (PBO), or ceramic. In some examples, the thickness of dielectric structure 121 can range from approximately 3 μm to approximately 100 μm. In some examples, the thickness of dielectric structure 121 can refer to thicknesses of individual layers of dielectric structure 121. In some examples, the combined thickness of all layers of dielectric structure 121 can be similar to or equal to the thickness of second substrate 12. Dielectric structure 121 can maintain the shape of second substrate 12 and can also support conductive structure 122.

Conductive structure 122 can comprise or be referred to as one or more conductive layers, traces, pads, patterns, or under bumped metallization (UBM). Conductive structure 122 can comprise copper, aluminum, gold, silver, nickel, palladium, or an alloy. In some examples, the thickness of conductive structure 122 can range from approximately 3 μm to approximately 50 μm. In some examples, the thickness of conductive structure 122 can refer to thicknesses of individual layers of conductive structure 122. In some examples, the combined thickness of all layers of conductive structure 122 can be similar to or equal to the thickness of second substrate 12. Conductive structure 122 can provide electrical signal paths (e.g., vertical paths and/or horizontal paths) for electronic components 16 and 17.

Conductive structure 122 can comprise inner terminals 1221, outer terminals 1222, traces 1223, and embedded vias 1224. Inner terminals 1221 can be provided on the inner side of dielectric structure 121 (e.g., along substrate inner side 12A of second substrate 12). Inner terminals 1221 can be exposed from dielectric structure 121. Inner terminals 1221 can be coupled to traces 1223 and to embedded vias 1224. Inner terminals 1221 can comprise or be referred to as bond fingers, lands, or pads. Inner terminals 1221 and traces 1223 can comprise copper, aluminum, gold, silver, nickel, palladium, or an alloy. In some examples, the thicknesses of inner terminals 1221 and traces 1223 can range from approximately 3 μm to approximately 50 μm.

Outer terminals 1222 can be provided on the outer side of dielectric structure 121 (e.g., along substrate outer side 12B of second substrate 12). Outer terminals 1222 can be exposed from dielectric structure 121. Outer terminals 1222 can be coupled to embedded vias 1224 and traces 1223. Outer terminals 1222 can comprise or be referred to as bond fingers, lands, or pads. Outer terminals 1222 can comprise copper, aluminum, gold, silver, nickel, palladium, or an alloy. In some examples, the thicknesses of outer terminals 1222 can range from approximately 3 μm to approximately 50 μm. In some examples, a portion 12BA of substrate outer side 12B is devoid of conductive structure 122 or of outer dielectric layer 1210. In accordance with various examples, portion 12BA of substrate outer side 12B forms part of passage 24 between first substrate 11 and second substrate 12. In some examples, the portion (for example, portion 12BA) of second substrate 12 between first opening 123A and second opening 123B has a decreased thickness compared to the portions of second substrate 12 between first opening 123A and the outer perimeter of second substrate 12 and between second opening 123B and the outer perimeter of second substrate 12.

Embedded vias 1224 provide electrical connection paths in an approximately vertical direction in dielectric structure 121 and can be coupled to inner terminals 1221, outer terminals 1222, or traces 1223. In some examples, the width (or diameter) of embedded vias 1224 can range from approximately 3 μm to approximately 100 μm. Traces 1223 provide electrical connection paths in an approximately horizontal direction (e.g., a direction generally perpendicular to embedded vias 1224) in dielectric structure 121.

In some examples, outer dielectric layer 1210 is provided over one or more of substrate inner side 12A or substrate outer side 12B to protect conductive structure 122. Openings can be provided in outer dielectric layer 1210 to expose portions of inner terminals 1221 or outer terminals 1222. In some examples, outer dielectric layer 1210 comprises a solder mask. In some examples, edge portions of substrate inner side 12A and substrate outer side 12B are devoid of outer dielectric layer 1210 as illustrated in FIGS. 2B and 2B-1, which leaves a portion of conductive structure 122 or dielectric structure 121 exposed. In some examples, this enhances the adhesion between first substrate 11 and second substrate 12 and between second substrate 12 and housing 21, which will be described in more detail later.

Second substrate 12 can comprise similar materials and can be manufactured using similar processes as described previously for first substrate 11.

FIGS. 2C and 2C-1 illustrate cross-sectional views of electronic device 10 at a later stage of manufacture. In the example illustrated in FIGS. 2C and 2C-1, second substrate 12 can be coupled to first substrate 11. In some examples, substrate interconnects 23 are used to couple outer terminals 1222 of second substrate 12 to inner terminals 1111 of first substrate 11 and attachment material 22 is used to couple the outer edges of first substrate 11 and second substrate 11 together. In some examples, substrate interconnects 23 can be conductive bumps or conductive pillars. In some examples, substrate interconnects 23 can be a conductive paste provided using a printing process. Attachment material 22 can comprise an insulating epoxy material, which can be thermally conductive. Attachment material 22 is configured to isolate or provide an environmentally isolating seal (for example, an air-tight seal) for passage 24. That is, passage 24 is a sealed passage.

By leaving portions of the edges of first substrate 11 and second substrate 12 devoid of outer dielectric layers 1110 and 1210, it was found in practice that better adhesion is achieved with attachment material 22 thereby providing a more reliable bond between first substrate 11 and second substrate 12. In other examples, substrate interconnects 23 can be used instead of attachment material 22 where an electrically conductive path (e.g., a ground path) is required between conductive structure 112 and conductive structure 122 at the edges of first substrate 11 and second substrate 12. In other examples, portions of conductive structures 112 and 122 at the edges of first substrate 11 and second substrate 12 can comprise dummy structures (that is, comprise electrically open structures) configured to improve adhesion with substrate interconnects 23 or attachment material 22. The dummy structures can be designed specifically to enhance adhesion.

As illustrated in FIG. 2C, first openings 123A are fluidly coupled to or are in fluid communication with passage 24 between first substrate 11 and second substrate 12. As illustrated in FIGS. 2C and 2C-1, passage 24 is fluidly coupled to or in fluid communication with second opening 123B. In some examples, the combination of second substrate 12 coupled to first substrate 11 can be referred to as a substrate structure.

FIGS. 2D and 2D-1 illustrate cross-sectional views of electronic device 10 at a later stage of manufacture. In the example illustrated in FIGS. 2D and 2D-1, electronic component 16 and electronic component 17 are provided and coupled to second substrate 12 adjacent to substrate inner side 12A. In some examples, electronic component 16 and electronic component 17 can be coupled to substrate inner side 12A with component adhesive 26. Component adhesive 26 can adhere lower side 16B of electronic component 16 and lower side 17B of electronic component 17 to substrate inner side 12A of second substrate 12. In some examples, component adhesive 26 can coated onto substrate inner side 12A by: a coating method such as spin coating, doctor blade, casting, painting, spray coating, slot die coating, curtain coating, slide coating, or knife over edge coating; a printing method such as screen printing, pad printing, gravure printing, flexographic printing or offset printing; an inkjet printing, a technology intermediate between coating and printing; or direct attachment of an adhesive film or adhesive tape. In some examples, component adhesive 26 can comprise or be referred to as an adhesive layer or an adhesive film. The thickness of component adhesive 26 can range from 5 µm to 60 µm. In some examples, component adhesive 26 comprises a thermally conductive and electrically insulating material or a thermally conductive and electrically conductive material.

Electronic component 16 is coupled to substrate inner side 12A so that pressure lead hole 162 is vertically aligned with second opening 123B. That is, pressure lead hole 162 is in communication with passage 24 through second opening 123B. Component adhesive 26 forms an environmentally isolating seal (for example, an air-tight seal) around the perimeter of electronic component 16 so that pressure lead hole 162 is environmentally isolated from top side 16A of electronic component 16.

In some examples, electronic component 16 comprises component terminals 161 adjacent to or over top side 16A, and electronic component 17 comprises component terminals 171 adjacent to or over top side 17A. In some examples, component terminals 161 and component terminals 171 can comprise or be referred to as bumps or bond pads. In some examples, component terminals 161 and 171 can comprise a metallic material, aluminum (Al), Cu, an Al alloy, or Cu alloy. In some examples, the thickness of component terminals 161 and 171 can range from about 5 µm to about 20 µm.

In some examples, component terminals 161 are coupled to a first portion of component terminals 171 with component interconnects 164 and a second portion of component terminals 171 are coupled to inner terminals 1221 of second substrate 12 with component interconnects 172. In some examples, each component interconnect 164, 172 can comprise or referred to as a conductive wire or a bonding wire. In some examples, component interconnects 164, 172 can comprise Au, Al, or Cu. In some examples, component interconnects 164 can be bonded to component terminals 161 by wire bonding equipment in the form of a wire, and can then be bonded to component terminals 171, thereby coupling electronic component 16 and electronic component 17. In some examples, component interconnects 172 can be bonded to component terminals 171 by wire bonding equipment in the form of a wire, and can then bonded to inner terminals 1221, thereby coupling electric component 17 to second substrate 12. In some examples, the thickness (e.g., the diameter) of component interconnects 164, 172 can range from approximately 15 µm to 30 µm.

Although electronic component 17 is shown coupled to second substrate 12 in a face-up and wirebonded configuration with wires, there can be examples where electronic component 17 is coupled to second substrate 12 in a face-down or flip-chip configuration with bumps. In some examples, electronic component 16 can be coupled to inner terminals 1221, which can be coupled to electronic component 17 through traces 1223 to electrically connect electronic component 16 to electronic component 17.

Figure 2E:
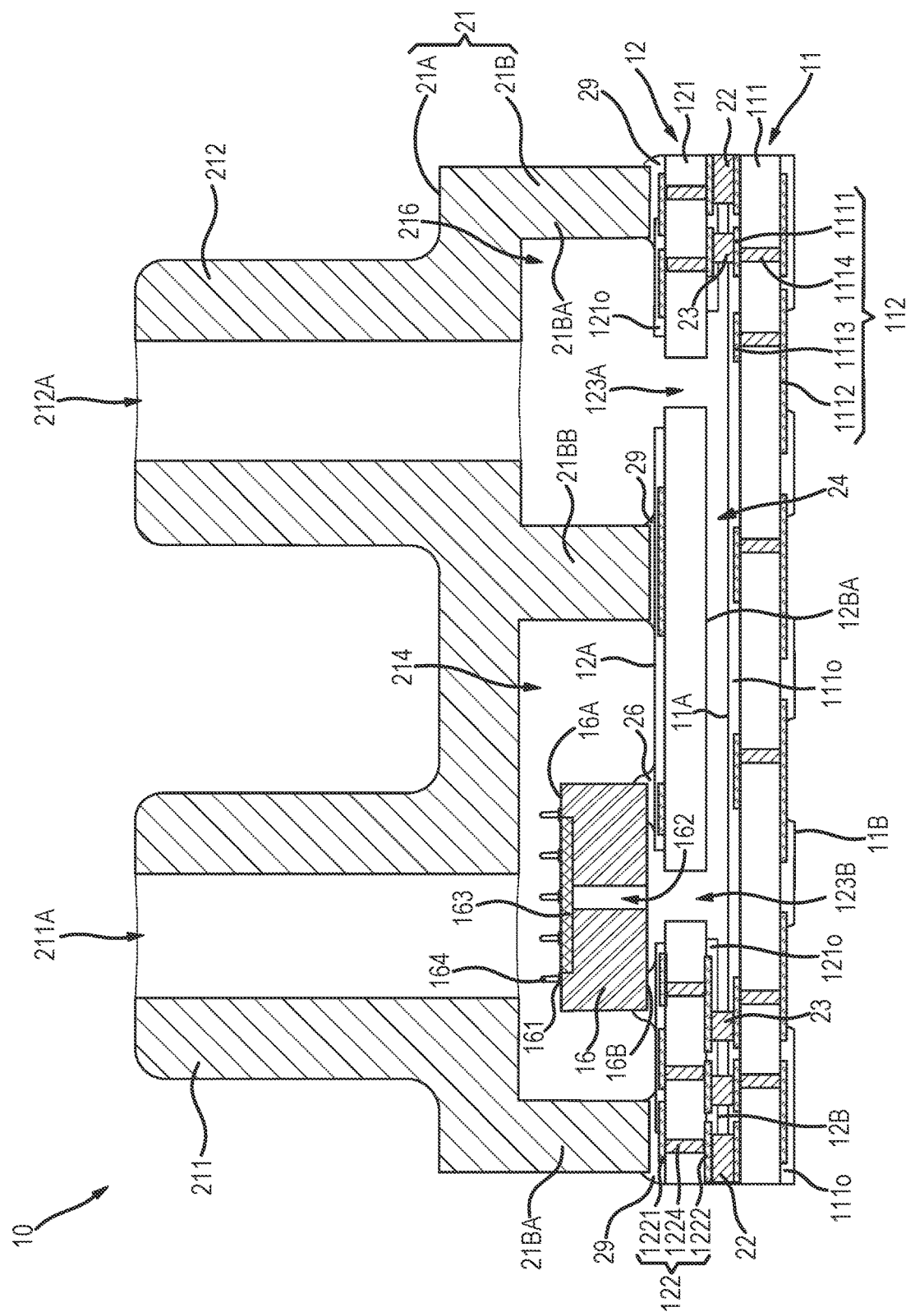
Figures 1, 2E:
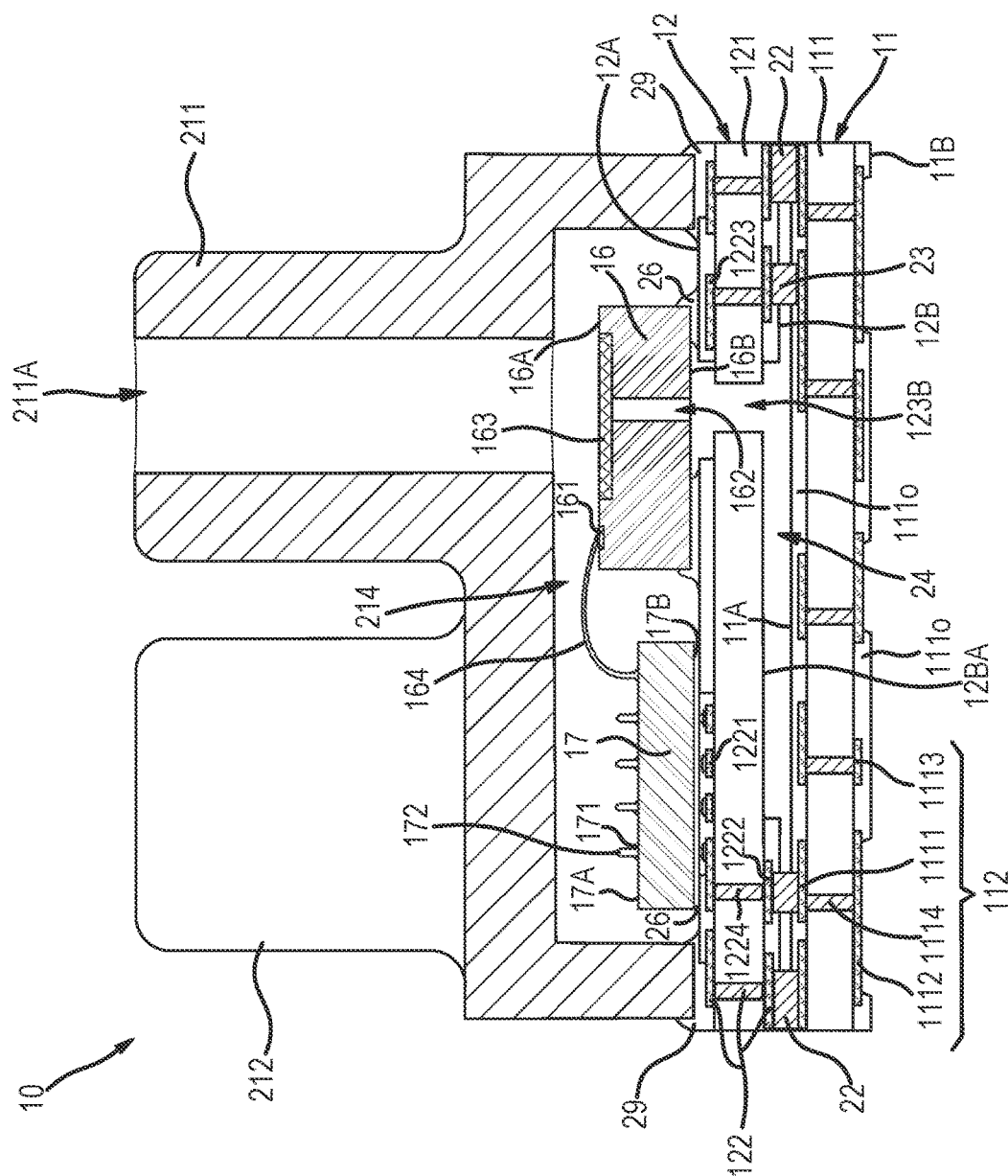

FIGS. 2E and 2E-1 illustrate cross-sectional views of electronic device 10 at a later stage of manufacture. In the example illustrated in FIGS. 2E and 2E-1, housing 21 can be provided and coupled to second substrate 12. In the present example, housing 21 is a single-piece or integral housing that can be provided using injection molding techniques, 3D printing techniques, or other techniques as known to one of ordinary skill in the art. In some examples, housing 21 comprises an insulating material. In some examples, housing 21 comprises a polymer, such as a liquid crystal polymer. One advantage of housing 21 is that it can be designed so that first chamber 214 and second chamber 216 are sized to accommodate different placements and the number of electronic components, such as electronic components 16 and 17. In this way, housing 21 is a more universal housing compared to previous devices, which enables the use of one housing to manufacture different types of electrical devices.

Housing 21 includes housing top 21A, which is distal to and spaced apart from substrate inner side 12A of second substrate 12, and housing walls 21B extending from housing top 21A towards substrate inner side 21A. In the present example, housing walls 21B comprise outer housing wall 21BA and inner housing wall 21BB. In some examples, outer housing wall 21BA defines a perimeter for housing 21 and can be provided with dimensions similar to the dimensions of second substrate 12. Housing walls 21B and housing top 21A define first chamber 214 and second chamber 216. Second chamber 216 can be separated or isolated from first chamber 214 by inner housing wall 21BB. Housing 21 further includes first port 211 with passage 211A, which is fluidly coupled to or in fluid communication with first chamber 214, and second port 212 with passage 212A, which is fluidly coupled to or in fluid communication with second chamber 216.

Housing 21 can be coupled to substrate inner side 12A of second substrate 12 with attachment material 29. In some examples, housing walls 21B are coupled to top side 12A of second substrate so that first chamber 214 encloses electronic component 16 and electronic component 17, and second chamber 216 is over first openings 123A. In this way, second chamber 216 is fluidly coupled to or in fluid communication with passage 24 through first openings 123A in second substrate 12. In other examples, additional electronic components can be coupled to second substrate 12 and can be enclosed within second chamber 216. In some examples, attachment material 29 comprises an epoxy adhesive that forms an environmentally isolating seal (for example, an air-tight seal) between housing 21 and second substrate 12. As described previously, conductive structure 122 at the perimeter or outer edges of second substrate 12 can be devoid of outer dielectric layer 1210, which was found in practice to improve the adhesion of attachment material 29 thereby improving the bond strength between housing 21 and second substrate 12.

One advantage of the present example is that housing 21 is directly coupled to second substrate 12, which saves on board space compared to previous devices. In addition, the configuration of first substrate 11 and second substrate 12 allows for the use of a single sensor device to be exposed to different separate and isolated stimuli or environmental conditions. This reduces the number of sensors required for certain applications compared to previous devices. In addition, first substrate 11 and second substrate 12 facilitate increased routing capability in a small footprint packaged electronic device.

Although electronic device 16 and electronic device 17 are illustrated as both being within first chamber 214, it is understood that electronic device 17 can be external to first chamber 214. In some examples, electronic device 17 can be within second chamber 216 and electrically coupled to electronic device 16 through, for example, conductive structure 122.

It is understood that the dimensions of first chamber 214, second chamber 216, passage 211A, passage 212A, first openings 123A, second openings 123B, or passage 24 can adjusted in accordance with required application specifications. That is, these structural elements can be used to tune electronic device 10 for specific application specifications.

Figure 3A:
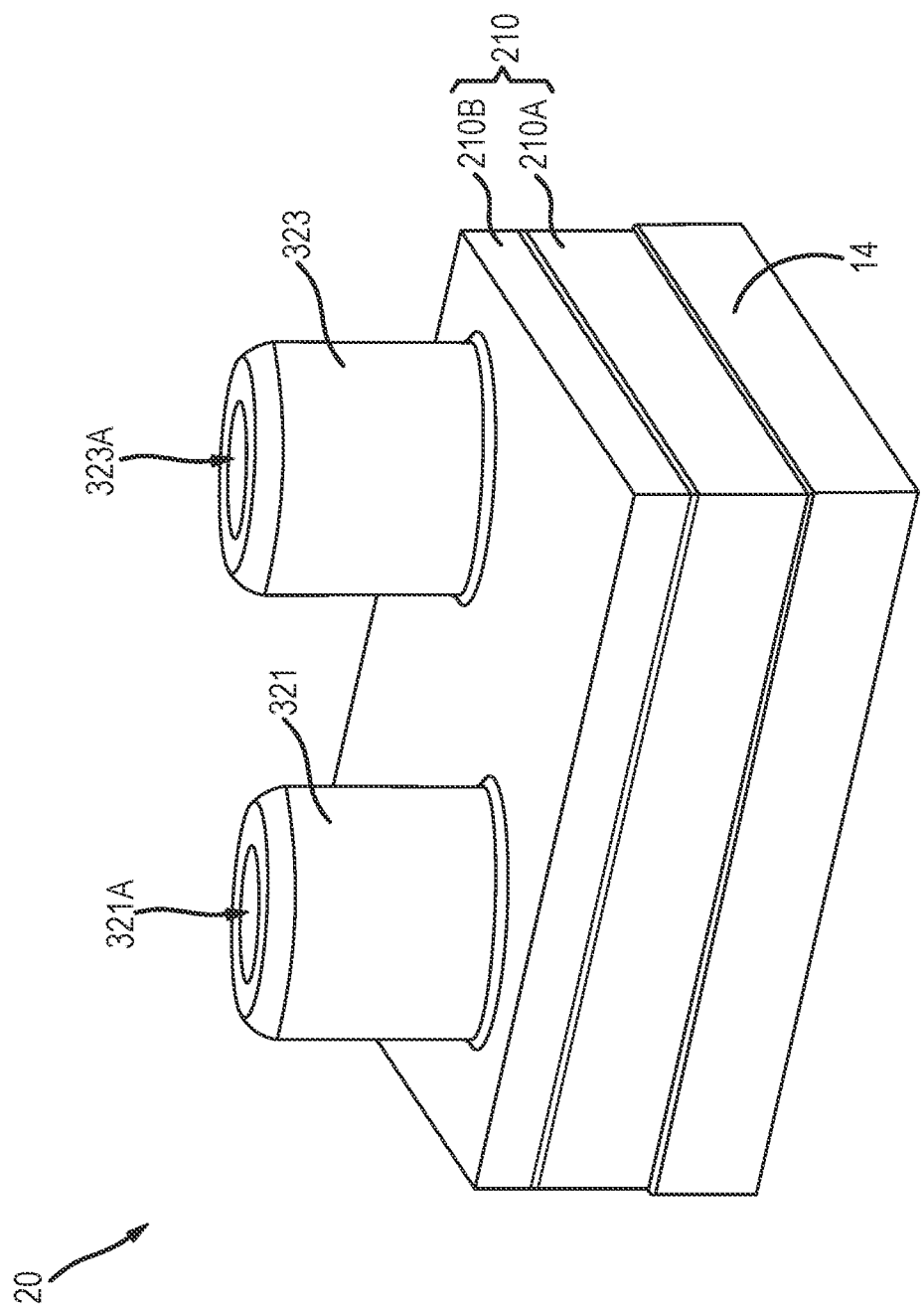
FIG. 3A illustrates a perspective view of an example electronic device.
Figure 3B:
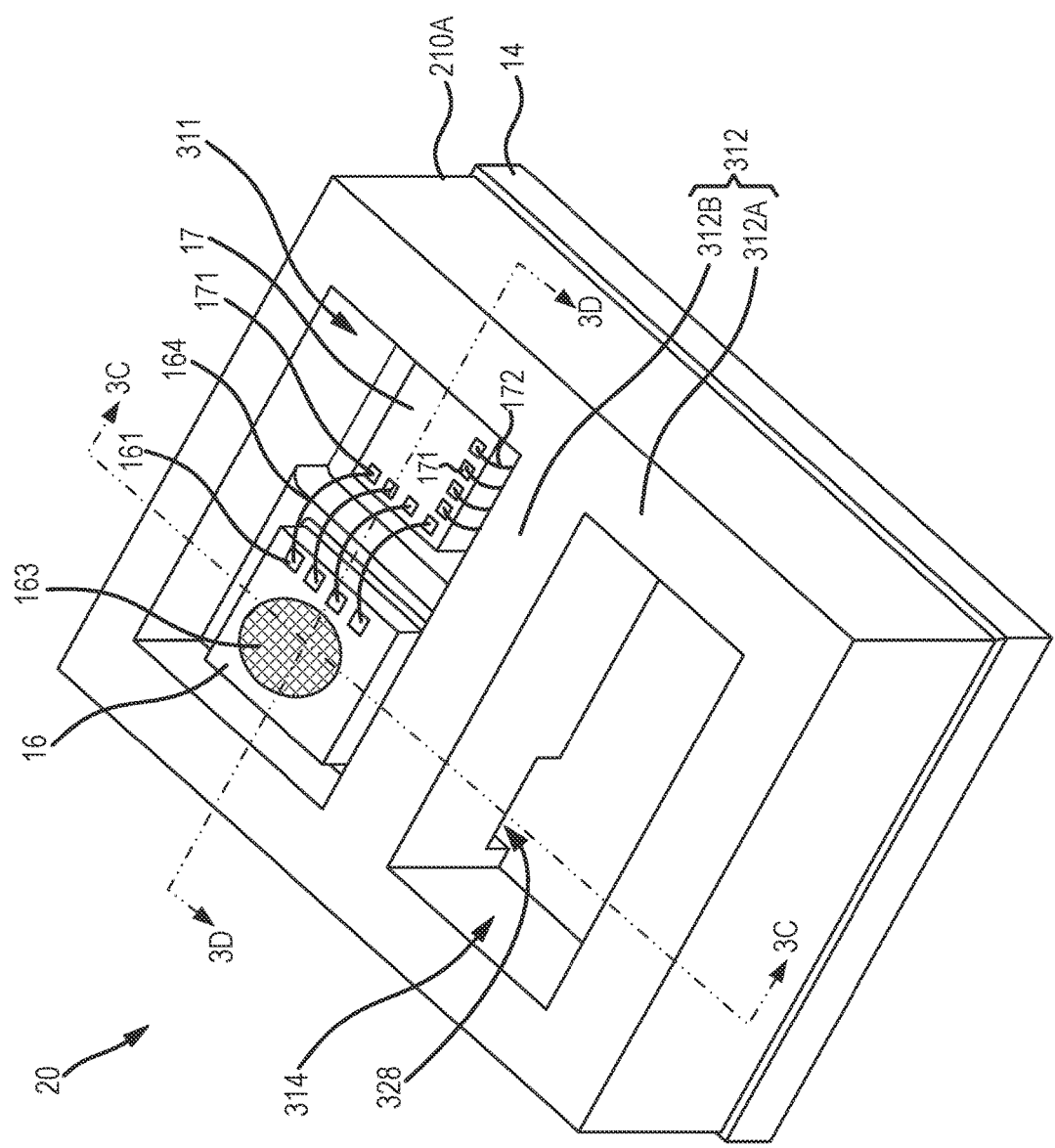
FIG. 3B illustrates a perspective view of a portion of the example electronic device of FIG. 3A.
Figure 3C:
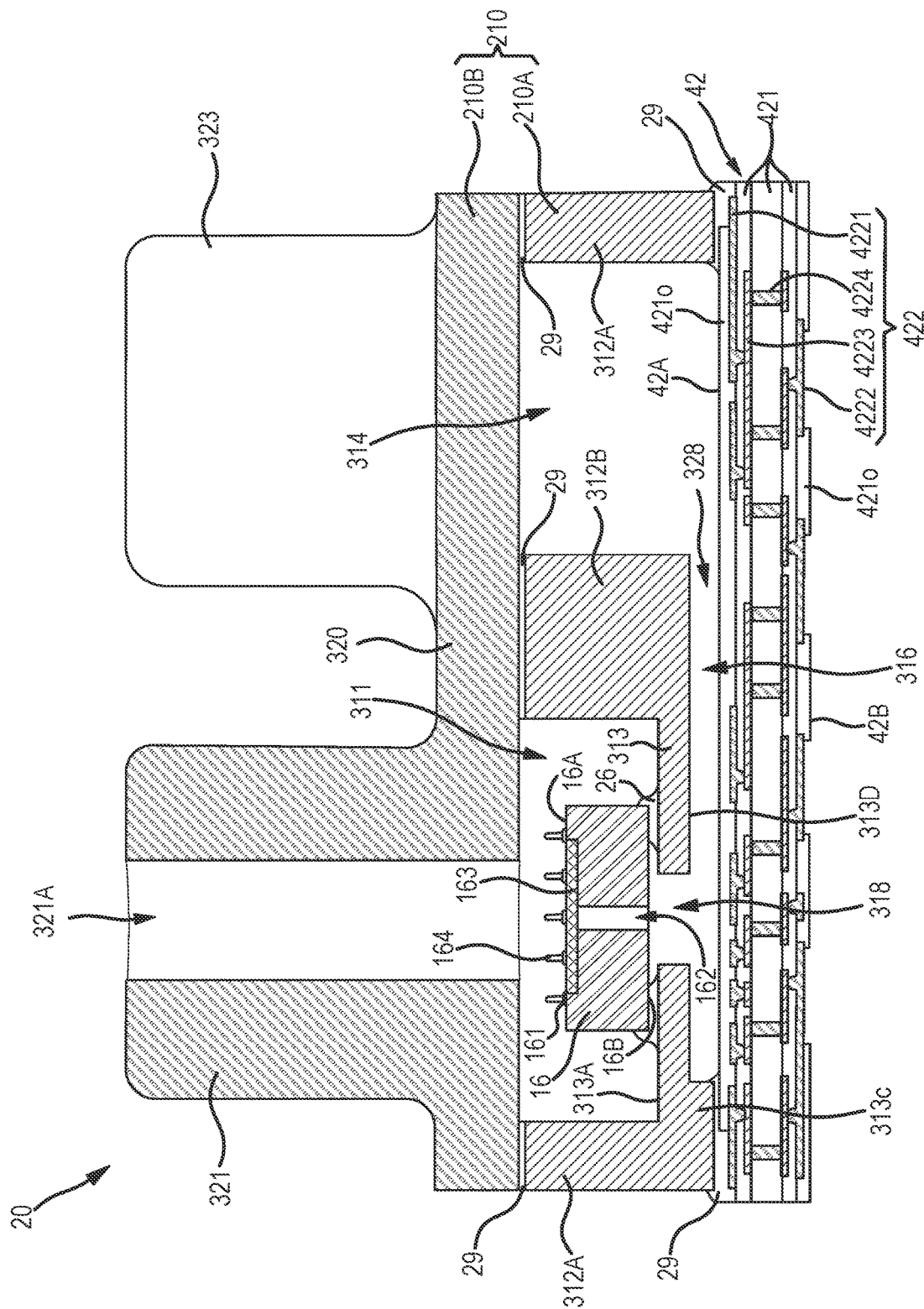
FIG. 3C illustrates a cross-sectional view of the example electronic device of FIG. 3A taken along reference line 3C-3C of FIG. 3B.
Figure 3D:
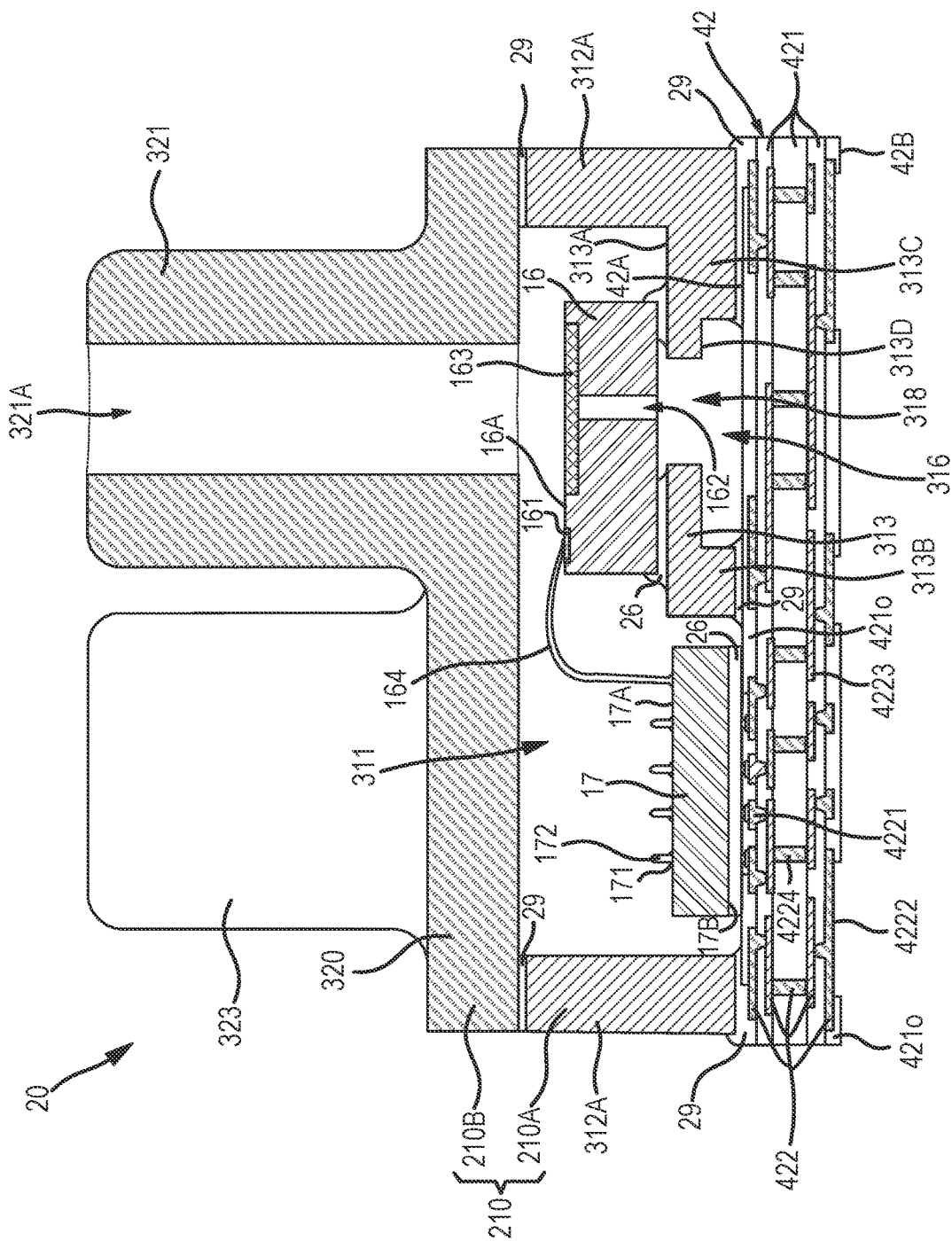
FIG. 3D illustrates a cross-sectional view of the example electronic device of FIG. 3A taken along reference line 3D-3D of FIG. 3B.

FIG. 3A illustrates a perspective view of an example electronic device 20, FIG. 3B illustrates a perspective view of a portion of electronic device 20, FIG. 3C illustrates a cross-sectional view of electronic device 20 taken along reference line 3C-3C of FIG. 3B, and FIG. 3D illustrates a cross-sectional view of electronic device 20 taken along reference line 3D-3D of FIG. 3B. Electronic device 20 has some similarity in construction to electronic device 10 and such similarity will not be repeated here. In this regard, only distinctions between electronic device 20 and electronic device 10 will be described hereinafter.

In the example illustrated in FIGS. 3A to 3D, electronic device 20 can comprise a substrate 42, electronic component 16, electronic component 17, and a housing 210. In the present example, electronic device 20 is configured as a differential pressure sensor device; however, it is understood that the present description is relevant to any type of electronic device where exposing multiple portions of an electronic component to multiple stimuli are required. For example, electronic device 20 can be configured as a variable force actuator, a multi-environment sensor, a temperature sensor, a chemical sensor, or other sensor devices as known to one of ordinary skill in the art.

In the present example, housing 210 comprises a multi-piece housing configuration, and can include a first housing portion 210A and a second housing portion 210B coupled to first housing portion 210A. In some examples, attachment material 29 can be used to couple first housing portion 210A to substrate 42 and to couple second housing portion 210B to first housing portion 210A. In some examples, attachment material 29 provides an environmentally isolating seal (for example, an air-tight seal) between first housing portion 210A and substrate 42 and between second housing portion 210B and first housing portion 210A.

Second housing portion 210B comprises a base 320, a first port 321 extending from a first part of an upper side of base 320, and a second port 323 extending from a second part of the upper side of base 320. In some examples, first port 321 and second port 323 can have a cylindrical shape. In other examples, first port 321 and second port 323 can have other shapes and can each comprise a different shape. First port 321 comprises a passage 321A extending through first port 321 and base 320, and second port 323 comprises a passage 323A that extends through second port 323 and base 320.

In the present example, first housing portion 210A comprises walls 312, which include an outer housing wall 312A that defines an outer periphery for housing 210, and an inner housing wall 312B, which includes an opening 328 that extends through inner housing wall 312B. In addition, first housing portion 210A comprises a pedestal 313 that extends laterally between outer housing wall 312A and one side of inner housing wall 312B. Pedestal 313 comprises an opening 318 that extends from a top side 313A of pedestal 313 to a lower side 313D of pedestal 313. Pedestal 313 comprises an edge 313B and an edge 313C that, in some examples, each extend from lower side 313D.

In the present example, lower side 16B of electronic component 16 is coupled to top side 313A of pedestal 313 with component adhesive 26 such that pressure lead hole 162 of electronic component 16 is vertically aligned with opening 318. In some examples, inner housing wall 312B, pedestal 313, and a substrate inner side 42A of substrate 42 define a passage 316, which is fluidly coupled to or in fluid communication with opening 318 and lower side 16B of electronic component 16. In the present example, passage 316 is fluidly coupled to or in fluid communication with opening 328. Pedestal 313 can also be referred to as a raised platform structure that is spaced apart from substrate 42.

Housing 210 defines a first chamber 311, which is fluidly coupled to or in fluid communication with top side 16A of electronic component 16, and defines a second chamber 314, which is fluidly coupled to or in fluid communication with lower side 16B of electronic device 16 through opening 328 in inner housing wall 312B, passage 316, and opening 318 in pedestal 313. Passage 321A within first port 321 is fluidly coupled to or is in fluid communication with top side 16A of electronic component 16 through first chamber 311. Passage 323A within second port 323 is fluidly coupled to or is in fluid communication with second chamber 314. More particularly, passage 321A and first chamber 311 provide a first pathway for a first stimulus, such as a first environmental condition, to reach top side 16A of electronic component 16, and passage 323A, second chamber 314, and passage 316 provide a second pathway (which is isolated from the first pathway) for a second stimulus, such as a second environmental condition, to reach lower side 16B of electronic component 16. In various examples, the first environmental condition can be a first pressure and the second environmental condition can be a second pressure. Electronic component 16 can be configured to measure the pressure differential between the first pressure and the second pressure and, together with electronic component 17, can be used to detect an event, such as automotive collision and send a signal to deploy a safety apparatus, such as an air bag.

In some examples, housing 210 comprises an insulating material. In some examples, housing 210 comprises a polymer, such as a liquid crystal polymer, and can be formed using injection molding techniques, 3-D printing techniques, or other techniques as known to one of ordinary skill in the art. Housing 210 can be coupled to top side 42A of substrate 42 with attachment material 29, which provides an environmentally isolating seal (for example, an air-tight seal) between housing 210 and substrate 42.

Substrate 42 and housing 210 can comprise or be referred to as an electronic package or a package and can protect electronic component 16 and electronic component 17 from exposure to external elements or the environment. The electronic package can also provide coupling between electronic component 16 and electronic component 17 and between electronic components 16 and 17 and external components or other electronic packages.

FIGS. 4A, 4A-1, 4B, 4B-1, 4C, 4C-1, 4D, 4D-1 illustrate cross-sectional views of an example method for manufacturing an example electronic device 20. The cross-sections of FIGS. 4A, 4B, 4C, and 4D are taken along reference line 3C-3C of FIGS. 3B, and the cross-sections of FIGS. 4A-1, 4B-1, 4C-1, and 4D-1 are taken along reference line 3D-3D of FIG. 3B.

FIGS. 4A and 4A-1 illustrate a cross-sectional view of electronic device 20 at an early stage of manufacture. In the example shown in FIGS. 4A and 4A-1, substrate 42 can be provided. In some examples, substrate 42 can comprise or be referred to as an Ajinomoto build-up film (ABF) circuit board, a rigid printed circuit board, a flexible printed circuit board, a laminate substrate, a RDL substrate, a coreless substrate, a ceramic substrate, a glass substrate, a silicon substrate, or a package substrate.

Substrate 42 can comprise dielectric structure 421 and conductive structure 422. Substrate 42 can also comprise a substrate inner side 42A and a substrate outer side 42B opposite substrate inner side 42A. Dielectric structure 421 can comprise or be referred to as one or more dielectric layers. Conductive structure 422 can comprise or be referred to as one or more conductive layers, traces, pads, patterns, or under bumped metallization (UBMs). Conductive structure 422 can comprise inner terminals 4221, outer terminals 4222, traces 4223, and embedded vias 4224. Inner terminals 4221 and outer terminals 4222 can be exposed from dielectric structure 421 (e.g., from substrate inner side 42A of substrate 42 and substrate outer side 42B of substrate 42). Embedded vias 4224 provide electrical connection paths in an approximately vertical direction in dielectric structure 421, and can be coupled to inner terminals 4221, traces 4223, and outer terminals 4222. Conductive structure 422 can comprise similar materials and dimensions as described previously for conductive structures 112 and 122.

In some examples, dielectric structure 421 comprises an outer dielectric layer 4210 over substrate inner side 42A and substrate outer side 42B to protect portions of conductive structure 422. Openings can be provided in outer dielectric layer 4210 to expose portions of inner terminals 4221 and outer terminals 4222. In some examples, outer dielectric layer 4210 can comprise a masking material, such as a solder mask. In some examples, a portion of outer dielectric layer 4210 does not extend to the edges of substrate 42. That is, the outer edges of substrate 42 at substrate inner 42A are devoid of outer dielectric layer 4210 leaving a portion of conductive structure 422 exposed. As described previously, this feature enhances the adhesion between substrate 42 and housing 210.

Substrate 42 is an example of a substrate structure. Substrate 42 can comprise similar materials and can be manufactured using similar processes as described previously for first substrate 11.

Figure 4B:
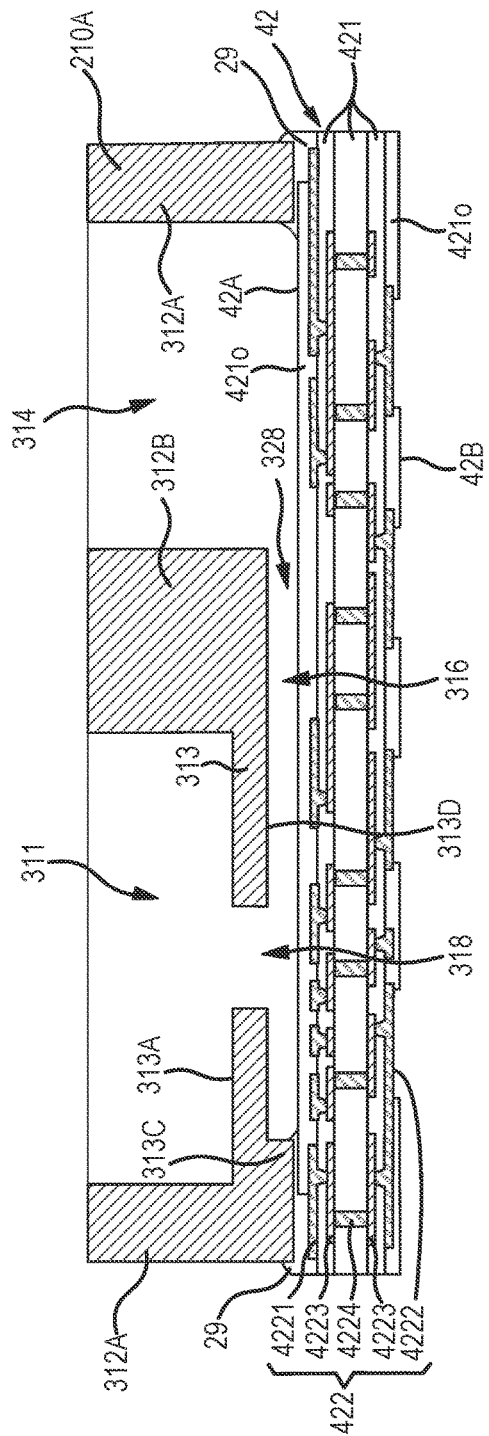
Figures 1, 4B:
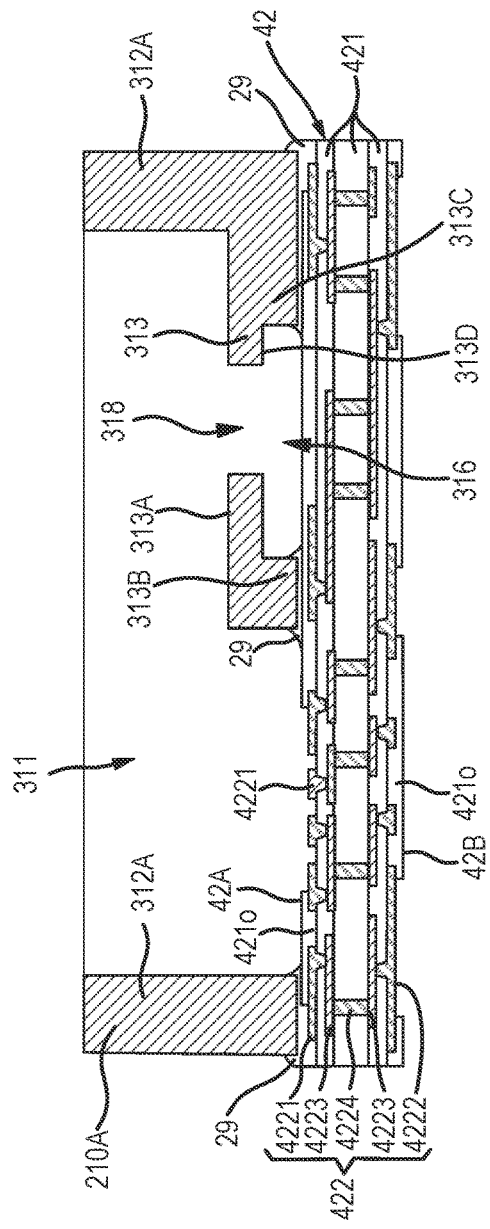

FIGS. 4B and 4B-1 illustrate cross-sectional views of electronic device 20 at a later stage of fabrication. In the example illustrated in FIGS. 4B and 4B-1, first housing portion 210A can be provided and coupled to substrate 42. In some examples, first housing portion 210A is a single-piece or integrated housing portion and can be provided using injection molding techniques or 3D printing techniques. In the present example, pedestal 313 is integrated with a portion of outer housing wall 312A and a portion of inner housing wall 312B. In some examples, first housing portion 210A comprises an insulating material. In some examples, first housing portion 210A comprises a polymer, such as a liquid crystal polymer. First housing portion 210A can also be referred to as housing sidewalls.

In the present example, first housing portion 210A is provided comprising outer housing wall 312A, inner housing wall 312B, and pedestal 13 with opening 318. Inner housing wall 312B and pedestal 313 are configured to define passage 316 with substrate inner side 42A of substrate 42. In some examples, at least a portion of pedestal 313 is elevated above substrate inner side 42A to define a portion of passage 316. First housing portion 210A further defines a portion of first chamber 311 that includes pedestal 313 and defines a portion of second chamber 314, which is fluidly coupled to or in fluid communication with passage 316 through opening 328 in inner housing wall 312B. In the present example, first chamber 311 is configured to accommodate electronic device 16 coupled to top side 313A of pedestal 313 and electronic device 17 coupled to substrate inner side 42A.

Referring to FIG. 3B, opening 328 in inner housing wall 312B can have a rectangular shape; however, it is understood that opening 328 can comprise other shapes. In some examples, opening 328 can comprise a plurality of openings separated by portions of inner housing wall 312B. The plurality of openings can comprise different shapes and sizes.

As illustrated in FIG. 4B-1, in some examples pedestal 313 comprises edge 313B that extends from lower side 313D of pedestal 313 towards substrate inner side 42A. In some examples, pedestal 313 comprises an edge 313C that abuts top side 313A of pedestal 313 and outer housing wall 312A. That is, in some examples, first portions of pedestal 313 (for example, portions proximate to outer housing wall 312A and electronic component 16) have a thickness that is greater than the thickness of a second portions of pedestal 313 that are proximate to opening 318. In some examples, the thinner portions of pedestal 313 define, at least, a portion of passage 316. In some examples, edge 313C provides outer housing wall 312A with more surface area proximate to pedestal 313 for attaching to substrate 42A.

First housing portion 210A can be coupled to substrate inner side 42A of substrate 42 with attachment material 29. In some examples, attachment material 29 comprises an epoxy adhesive that forms an environmentally isolating seal (for example, an air-tight seal) between substrate 42 and first housing portion 210A, including outer housing wall 312A, inner housing wall 312B, and edges 313B and 313C of pedestal 313. As described previously, conductive structure 422 at the perimeter or outer edges of substrate 42 can be devoid of outer dielectric layer 4210, which was found in practice to improve the adhesion of attachment material 29, thereby improving the bond strength between first housing portion 210A and substrate 42. In some examples, portions of conductive structure 422 at the outer edges can comprise dummy structures. The dummy structures can be designed specifically to enhance adhesion.

One advantage of first housing portion 210A is that it can be designed so that first chamber 311 and second chamber 314 are sized to accommodate different placements of and the number of electronic components, such as electronic components 16 and 17. In addition, first housing portion 210A can be used with different variations of second housing portion 210B depending on application requirements. In this way, housing 210 is a more universal or configurable housing compared to previous devices, which enables the use of one housing to manufacture different types of electrical devices or enables support of different configurations providing more manufacturing flexibility compared to previous devices.

FIGS. 4C and 4C-1 illustrate cross-sectional views of electronic device 20 at a later stage of fabrication. In the example illustrated in FIGS. 4C and 4C-1, electronic components 16 and 17 are provided and coupled to first housing portion 210A and substrate 42, respectively. In the present example, electronic component 16 is coupled to pedestal 313 and electronic component 17 is coupled to substrate inner side 42A within first chamber 311. Electronic component 16 is coupled to pedestal 313 so that pressure lead hole 162 is vertically aligned with opening 318 that extends through pedestal 313. In some examples, component adhesive 26 is used to couple electronic component 16 to pedestal 313 and electronic component 17 to substrate 42. In the present example, component adhesive 26 forms an environmentally isolating seal (for example, an air-tight seal) around the perimeter of electronic component 16 so that pressure lead hole 162 is isolated from top side 16A of electronic component 16. Component adhesive 26 can be applied to substrate 42 and pedestal 313 as described previously.

In some examples, component terminals 161 over top side 16A of electronic component 16 are coupled to a portion of component terminals 171 over top side 17A of electronic component 17 with component interconnects 164 as described previously. Another portion of component terminals 171 is coupled to inner terminals 4221 of substrate 42 with component interconnects 172 as described previously.

Although electronic component 17 is shown coupled to substrate 42 in a face-up and wirebonded configuration with wires, there can be examples where electronic component 17 is coupled to substrate 42 in a face-down or flip-chip configuration with bumps. In some examples, electronic component 16 can be connected to inner terminals 4221, which can be coupled to electronic component 17 through conductive structure 422 to electrically connect electronic component 16 to electronic component 17.

Figure 4D:
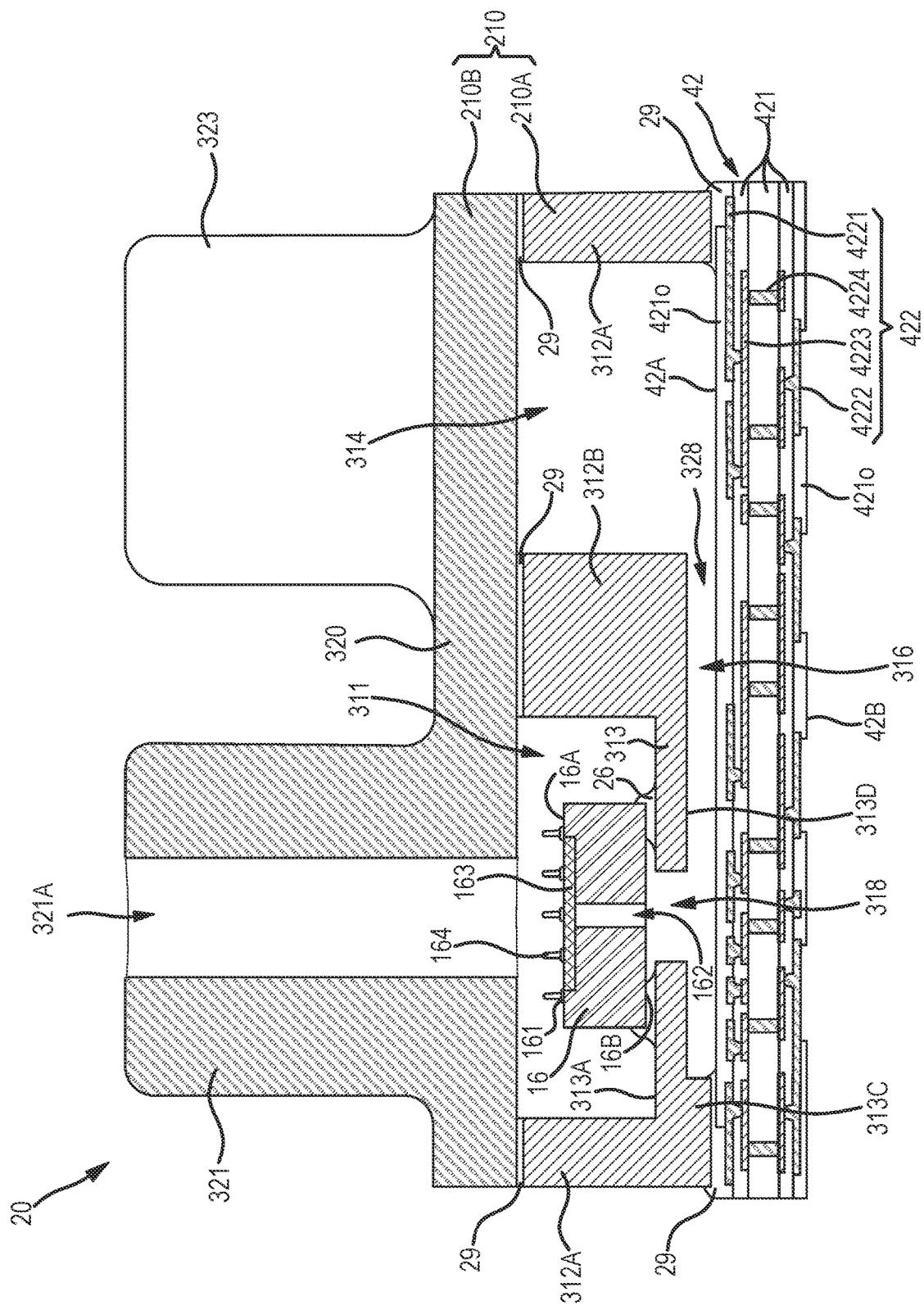
Figures 1, 4D:
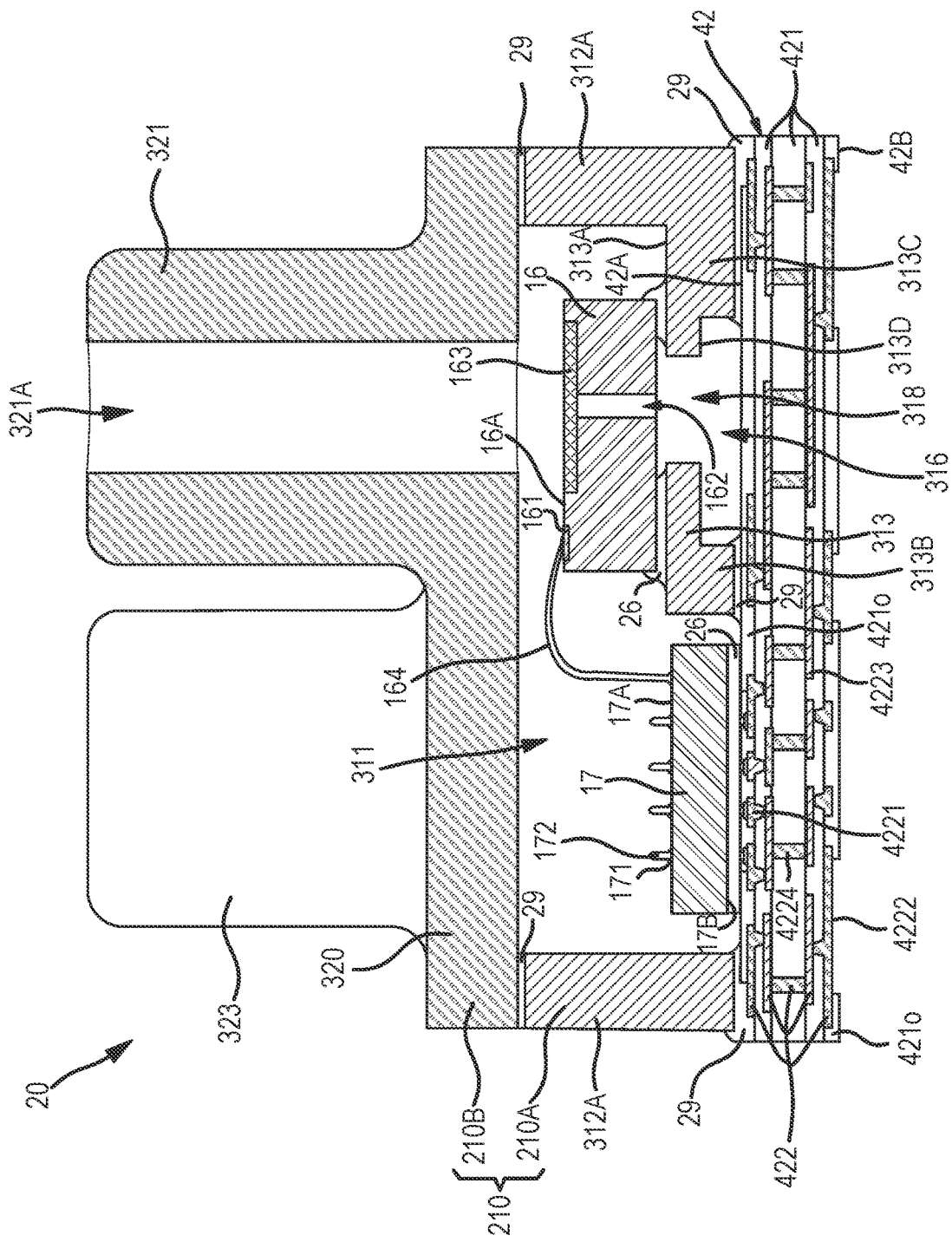

FIGS. 4D and 4D-1 illustrate cross-sectional views of electronic device 20 at a later stage of manufacture. In the example illustrated in FIGS. 4D and 4D-1, second housing portion 210B is provided and coupled to first housing portion 210A. In some examples, base 320 of second housing portion 210B is coupled to outer housing wall 312A and to inner housing wall 312B with attachment material 29, which forms an environmentally isolating seal (for example, an air-tight seal) that isolates first chamber 311 from second chamber 314. First port 321 and second port 323 are laterally spaced apart and extend outward from base 320. That is, the distal ends of first port 321 and second port 323 are distal to base 320. First port 321, which comprises passage 321A extending through first port 321 and base 320, is fluidly coupled to or is in fluid communication with first chamber 311. Second port 323, which comprises passage 323A extending through second port 323 and base 320, is fluidly coupled to or is in fluid communication with second chamber 314. In some examples, second housing portion 210B is a single-piece or integrated housing portion can be provided using injection molding techniques or 3D printing techniques. Second housing portion 210B can comprise an insulating material. In some examples, second housing portion 210B comprises a polymer, such as a liquid crystal polymer. Second housing portion 210B can also be referred to as a housing top.

In the present example, first chamber 311 encloses electronic component 16 and electronic component 17 and second chamber 314 is fluidly coupled to or in fluid communication with lower side 16B of electronic component 16 through opening 328 in inner housing wall 312B, passage 316, and opening 318 in pedestal 313. In other examples, additional electronic components can be coupled to substrate 42 and can be enclosed within first chamber 311 or second chamber 314. Although electronic device 16 and electronic device 17 are illustrated as both being within first chamber 311, it is understood that electronic device 17 can be external to first chamber 311. In some examples, electronic device 17 can be within second chamber 314 and electrically coupled to electronic device 16 through, for example, conductive structure 422.

One advantage of the present example is that housing 210 is directly coupled to substrate 42, which saves on board space compared to previous devices. In addition, the configuration of housing 210 allows for the use of a single sensor device to be exposed to different separate and isolated stimuli or environmental conditions. This reduces the number of sensors required for certain applications compared to previous devices.

It is understood that the dimensions of first chamber 311, second chamber 314, passage 321A, passage 323A, opening 318, opening 328, or passage 316 can be adjusted in accordance with required application specifications. That is, these structural elements can be used to tune electronic device 20 for specific application specifications.

In some examples, housing 21 and housing 210 or portions thereof can be provided with coatings or shielding structures to protect housing 21 and housing 210 from harsh environments or electrical components 16 and 17 from electrical events, such electro-magnetic interference (EMI) events.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:
1. An electronic device, comprising:
   a substrate structure comprising:
      a first substrate comprising:
         a first substrate inner side;
         a first substrate outer side opposite to the first substrate inner side;
         a first dielectric structure; and
         a first conductive structure; and
      a second substrate comprising:
         a second substrate inner side;
         a second substrate outer side;
         a second dielectric structure comprising a first outer dielectric layer adjacent to the second substrate inner side;
         a second conductive structure comprising:
            second substrate inner terminals adjacent to the second substrate inner side and comprising a second substrate first inner terminal, wherein the second substrate first inner terminal is at a peripheral edge of the second substrate inner side and exposed from the first outer dielectric layer;
            second substrate outer terminals adjacent to the second substrate outer side; second substrate traces adjacent to the second substrate inner side and coupled to the second substrate inner terminals; and
            second substrate embedded vias connecting the second substrate inner terminals and the second substrate traces to the second substrate outer terminals;
         a first opening extending from the second substrate inner side to the second substrate outer side;
         a second opening extending from the second substrate inner side to the second substrate outer side and laterally spaced apart from the first opening;
         an inner portion laterally extending between the first opening and the second opening; and
         a peripheral portion surrounding the inner portion;

wherein:
    the second substrate outer side is coupled to the first substrate inner side;
    the inner portion of the second substrate is spaced apart from the first substrate inner side to define a passage between the second substrate and the first substrate; and
    the passage is fluidly coupled with the first opening and the second opening;
a housing coupled to the second substrate and comprising:
    a housing top;
    housing walls;
    a first port extending outward from the housing top; and
    a second port extending outward from the housing top;
    wherein:
        the substrate structure, the housing top, and the housing walls define a first chamber and a second chamber isolated from the first chamber;
        the first opening is within the second chamber;
        the first port is fluidly coupled to the first chamber;
        the housing walls are attached to the second substrate first inner terminal and the first outer dielectric layer, and
        the second port is fluidly coupled to the second chamber; and
a first electronic component within the first chamber and comprising:
    a top side; and
    a lower side opposite to the top side and isolated from the top side;
    wherein:
        the top side is in fluid communication with the first chamber and the first port and is configured to receive a first stimulus; and
        the lower side is in fluid communication with the second opening, the second chamber, and the second port and is configured to receive a second stimulus.

2. The electronic device of claim 1, wherein:
the second substrate outer side within the inner portion is devoid of the second conductive structure.

3. The electronic device of claim 1, further comprising:
an attachment material;
wherein:
    the first dielectric structure comprises a second outer dielectric layer adjacent to the first substrate inner side;
    the first conductive structure comprises:
        first substrate inner terminals adjacent to the first substrate inner side and comprising a first substrate first inner terminal, wherein the first substrate first inner terminal is at a peripheral edge of the first substrate inner side and exposed from the second outer dielectric layer;
        first substrate outer terminals adjacent to the first substrate outer side;
        first substrate traces adjacent to the first substrate inner side and coupled to the first substrate inner terminals; and
        first substrate embedded vias connecting the first substrate inner terminals and the first substrate traces to the first substrate outer terminals;
    the second dielectric structure comprises a third outer dielectric layer adjacent to the second substrate outer side;
    the second substrate outer terminals comprise a second substrate first outer terminal at a peripheral edge of the second substrate outer side and exposed from the third outer dielectric layer;
    the second substrate first outer terminal is exposed from the third outer dielectric layer; and
    the first substrate first inner terminal is directly attached to the second substrate first outer terminal with the attachment material.

4. The electronic device of claim 1, wherein:
the first electronic component is coupled to the second substrate inner side with the lower side aligned to the second opening.

5. The electronic device of claim 1, wherein:
the housing comprises a single-piece housing.

6. The electronic device of claim 1, wherein:
the passage is isolated from the first chamber.

7. The electronic device of claim 1, wherein:
the first electronic component comprises a sensor.

8. The electronic device of claim 1, further comprising:
an attachment material;
wherein:
    the housing walls are directly attached to the second substrate first inner terminal and the first outer dielectric layer with the attachment material; and
    the second substrate first inner terminal comprises a dummy structure.

9. The electronic device of claim 1, further comprising:
an attachment material;
substrate interconnects; and
a second electronic component coupled to the first electronic component and the substrate structure;
wherein:
    the second conductive structure at the second substrate outer side is attached to the first conductive structure at the first substrate inner side with the substrate interconnects;
    the second substrate outer side is attached to the first substrate inner side at a peripheral region with the attachment material; and
    the attachment material provides an air-tight seal for the passage.

10. The electronic device of claim 1, wherein:
the first electronic component comprises a differential pressure sensor;
the top side of the first electronic component is configured to receive a first pressure stimulus; and
the lower side of the first electronic component is configured to receive a second pressure stimulus.

11. An electronic device, comprising:
a substrate structure comprising:
    substrate interconnects;
    a first substrate comprising:
        a first substrate inner side;
        a first substrate outer side opposite to the first substrate inner side;
        a first dielectric structure; and
        a first conductive structure; and
    a second substrate comprising:
        a second substrate inner side;
        a second substrate outer side;
        a second dielectric structure comprising a first outer dielectric layer adjacent to the second substrate inner side;
        a second conductive structure comprising:
            second substrate inner terminals adjacent to the second substrate inner side;
            second substrate outer terminals adjacent to the second substrate outer side;

second substrate traces adjacent to the second substrate inner side and coupled to the second substrate inner terminals;
second substrate embedded vias connecting the second substrate inner terminals to the second substrate outer terminals; and
a dummy structure at a peripheral edge of the second substrate inner side and exposed from the first outer dielectric layer;
a first opening extending from the second substrate inner side to the second substrate outer side;
a second opening extending from the second substrate inner side to the second substrate outer side and laterally spaced apart from the first opening;
an inner portion laterally extending between the first opening and the second opening and comprising a first thickness; and
a peripheral portion surrounding the inner portion and comprising a second thickness;
wherein:
the second conductive structure at the second substrate outer side is attached to the first conductive structure at the first substrate inner side with the substrate interconnects;
the substrate interconnects space the second substrate apart from the first substrate to define a first passage between the inner portion of the second substrate and the first substrate; and
the first passage is fluidly coupled with the first opening and the second opening;
a housing attached to the dummy structure and the first outer dielectric layer and comprising:
a first chamber;
a second chamber isolated from the first chamber;
a first port comprising a second passage coupled to the first chamber; and
a second port comprising a third passage coupled to the second chamber; and
a first electronic component within the first chamber and comprising:
a top side; and
a lower side opposite to the top side and isolated from the top side;
wherein:
the top side is configured to receive a first stimulus through the second passage and the first chamber; and
the lower side is configured to receive a second stimulus through the third passage, the second chamber, and the first passage.

12. The electronic device of claim 11, further comprising:
an attachment material;
wherein:
the housing is directly attached to the dummy structure and the first outer dielectric layer with the attachment material;
the substrate interconnects comprise sidewalls; and
the sidewalls are exposed within the first passage.

13. The electronic device of claim 11, wherein:
the second thickness is greater than the first thickness.

14. The electronic device of claim 11, wherein:
the housing comprises a stacked housing.

15. A method of manufacturing an electronic device, comprising:
providing a substrate structure comprising:
substrate interconnects;
a first substrate comprising:
a first substrate inner side;
a first substrate outer side opposite to the first substrate inner side;
a first dielectric structure; and
a first conductive structure; and
a second substrate comprising:
a second substrate inner side;
a second substrate outer side;
a second dielectric structure comprising a first outer dielectric layer adjacent to the second substrate inner side;
a second conductive structure comprising:
second substrate inner terminals adjacent to the second substrate inner side;
second substrate outer terminals adjacent to the second substrate outer side;
second substrate traces adjacent to the second substrate inner side and coupled to the second substrate inner terminals;
second substrate embedded vias connecting the second substrate inner terminals to the second substrate outer terminals; and
a dummy structure at a peripheral edge of the second substrate inner side and exposed from the first outer dielectric layer;
a first opening extending from the second substrate inner side to the second substrate outer side;
a second opening extending from the second substrate inner side to the second substrate outer side and laterally spaced apart from the first opening;
an inner portion laterally extending between the first opening and the second opening; and
a peripheral portion surrounding the inner portion;
wherein:
the second conductive structure at the second substrate outer side is attached to the first conductive structure at the first substrate inner side with the substrate interconnects;
the substrate interconnects space the second substrate apart from the first substrate to define a first passage between the inner portion of the second substrate and the first substrate; and
the first passage is fluidly coupled with the first opening and the second opening;
providing a housing comprising:
a first chamber;
a second chamber isolated from the first chamber;
a first port comprising a second passage coupled to the first chamber; and
a second port comprising a third passage coupled to the second chamber;
providing a first electronic component comprising:
a top side; and
a lower side opposite to the top side;
coupling the first electronic component to one of the substrate structure or the housing within the first chamber; and
attaching the housing to the dummy structure and the first outer dielectric layer;

wherein:
the top side of the first electronic component is isolated from the lower side of the first electronic component;
the top side of the first electronic component is configured to receive a first stimulus within the first chamber; and
the lower side of the first electronic component is configured to receive a second stimulus through the third passage, the second chamber, and the first passage.

16. The method of claim 15, further comprising:
providing an attachment material;
wherein:
attaching the housing comprises directly attaching the housing to the dummy structure and the first outer dielectric layer with the attachment material; and
providing the substrate structure comprises exposing sidewall surfaces of the substrate interconnects with the first passage.

\* \* \* \* \*